(12) United States Patent
Koike

(10) Patent No.: US 7,462,428 B2
(45) Date of Patent: Dec. 9, 2008

(54) COMPLEMENTARY MASKS AND METHOD OF FABRICATION OF SAME, EXPOSURE METHOD, AND SEMICONDUCTOR DEVICE AND METHOD OF PRODUCTION OF SAME

(75) Inventor: Kaoru Koike, Ibaraki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/348,211

(22) Filed: Feb. 6, 2006

(65) Prior Publication Data

US 2006/0127824 A1 Jun. 15, 2006

Related U.S. Application Data

(63) Continuation of application No. 10/466,041, filed on Jul. 11, 2003, now Pat. No. 6,998,201.

(51) Int. Cl.
*G03F 9/00* (2006.01)
(52) U.S. Cl. ............................ 430/22; 430/5; 430/30; 430/296; 430/942
(58) Field of Classification Search .................... 430/5, 430/22, 30, 296, 942
See application file for complete search history.

(56) References Cited

U.S. PATENT DOCUMENTS

| 4,169,230 A | 9/1979 | Bohlen et al. |
| 4,591,540 A | 5/1986 | Bohlen et al. |
| 5,831,272 A | 11/1998 | Utsumi |
| 5,874,198 A | 2/1999 | Okino |
| 6,998,201 B2 * | 2/2006 | Koike .............................. 430/5 |
| 2001/0028984 A1 | 10/2001 | Yamashita et al. |

FOREIGN PATENT DOCUMENTS

| JP | 54-41076 | 3/1979 |
| JP | 59-222840 | 12/1984 |
| JP | 61-283121 | 12/1986 |
| JP | 05-160012 | 6/1993 |
| JP | 09-129541 | 5/1997 |
| JP | 11-87209 | 3/1999 |
| JP | 11-135423 | 5/1999 |
| JP | 2001-274072 | 5/2001 |

* cited by examiner

*Primary Examiner*—Christopher G Young
(74) *Attorney, Agent, or Firm*—Rockey, Depke & Lyons, LLC; Robert J. Depke

(57) ABSTRACT

A complementary mask has a plurality of pattern forming regions 34a, 34 having arranged on them complementary patterns 26, 28 obtained by dividing first circuit patterns into complementary patterns 26, 28 complementary with each other and formed by openings. The complementary patterns 26, 28 are arranged in the pattern forming regions 34a, 34b so that pattern densities of the pattern forming regions 34a, 34b become substantially the same.

1 Claim, 21 Drawing Sheets

COMPLEMENTARY MASKS AND METHOD OF FABRICATION OF SAME, EXPOSURE METHOD, AND SEMICONDUCTOR DEVICE AND METHOD OF PRODUCTION OF SAME

The subject matter of application Ser. No. 10/466,041 is incorporated herein by reference. The present application is a continuation of U.S. application Ser. No. 10/466,041, filed Jul. 11, 2003 now U.S. Pat. No. 6,998,201, which claims priority to Japanese Patent Application No. JP2001-345895, filed Nov. 12, 2001, and WIPO Patent Application No. PCT/JP02/11778, filed Nov. 12, 2002. The present application claims priority to these previously filed applications.

TECHNICAL FIELD

The present invention relates to complementary masks used in for example an exposure process in the process of manufacture of a semiconductor device and a method of fabrication of the same, an exposure method, and a semiconductor device and a method of production of the same.

BACKGROUND ART

In a charged particle beam exposure apparatus, for example, an electron beam exposure apparatus, when preparing circuit patterns (element formation patterns) of a large scale integrated circuit etc., a high level of processing capability per unit time (throughput) is required.

An electron beam exposure apparatus answering such a demand is disclosed in for example Japanese Unexamined Patent Publication (Kokai) No. 5-160012 and Japanese Patent No. 2951947.

FIG. 1 is a schematic view of an example of an electron beam exposure apparatus of a type similar to that disclosed in the above publications. This electron beam exposure apparatus 10 is configured as a so-called LEEPL type designed to make a wafer or other specimen (exposed body) moved at suitable times by operation of a table in a state with a stencil mask 20 fixed. In the description of the present application, "stencil mask" refers to a mask having opening areas with no substances present in the spaces.

As shown in FIG. 1, the electron beam exposure apparatus 10 is provided with an electron beam source 12 for emitting an electron beam Eb, a focusing optical system 14 for focusing the electron beam Eb, a main deflector 16 for deflecting the electron beam Eb focused by the focusing optical system 14, and a fine adjustment deflector 18 and projects the electron beam Eb passed through the fine adjustment deflector 18 via the stencil mask 20 to the surface of the specimen 21.

The electron beam exposure apparatus 10 is provided with a mask stage for holding the stencil mask 20 and the table for holding a specimen 21 at a location where the circuit patterns (opening patterns) are projected by the electron beam Eb passed through the stencil mask 20.

In the electron beam exposure apparatus 10 having the above configuration, the exposure is started in a state where the stencil mask 20 is mounted on the mask stage and then a specimen 21 having a resist film (not illustrated) coated on the surface is placed on the table.

At this time, when the electron beam Eb is emitted from the electron beam source 12, the electron beam Eb passed through the focusing optical system 14, main deflector 16, and fine adjustment deflector 18 passes through the circuit patterns of the stencil mask 20, then is exposed by projection onto the resist film at the surface of the specimen 21 as the circuit patterns.

In the electron beam exposure apparatus 10, however, the electron beam Eb used for the projection of the circuit patterns has a nature whereby energy is absorbed even when passing through a transparent substance for visible light or ultraviolet ray, so the stencil mask 20 cannot be configured by transparent, strong silica glass or the like. For this reason, in order to make the electron beam Eb pass well at the time of projection exposure, there is no method other than the method of forming the circuit patterns by openings.

In this way, the stencil mask 20 is a self-supporting type transmission mask where circuit patterns of regions passing the electron beam are all formed by openings, therefore cannot be provided with donut-shaped patterns where peripheries are all surrounded by openings. Accordingly, it is impossible to expose by projection donut-shaped patterns onto a specimen 21 by merely using one such stencil mask 20.

In order to solve the problem of the above donut-shaped patterns, the complementary mask division method for dividing one circuit pattern among a plurality of complementary stencil masks is disclosed in for example Japanese Examined Patent Publication (Kokoku) No. 7-66182.

In the complementary mask division method disclosed in this publication, the relatively simple layout of a semiconductor chip is divided into a plurality of sections, and the divided sections are assigned to two complementary stencil masks. Further, these two complementary stencil masks are used to sequentially expose sections of the layout formed at the complementary stencil masks onto the surface of the specimen (exposed body) and thereby transfer the entire circuit patterns.

In the description of the present application, "complementary masks" mean masks dividing patterns of a certain section and placing the parts on a plurality of masks or placing them on different areas of the same mask and able to form the patterns of that section as before division by overlaying the masks or different areas of the same mask to overlay the divided parts of the patterns.

Also, in the description of the present application, "complementary stencil masks" mean stencil masks dividing patterns of a certain section and placing the parts on a plurality of stencil masks or placing them on different areas of the same stencil mask and able to form the patterns of that section as before division by overlaying the stencil masks or different areas of the same stencil mask to overlay the divided parts of the patterns.

In the field of production of semiconductor integrated circuits in recent years, in response to the demand for further larger integration, there has been a trend toward an increase of the number of devices configuring the semiconductor integrated circuits and greater miniaturization of each device. Due to this, the circuit patterns comprised by the openings for exposing by projection the patterns of the devices onto the specimen by an irradiated electron beam are becoming more miniaturized.

Accordingly, the pattern density of the openings forming circuit patterns has increased. With the complementary stencil masks used in the above conventional complementary mask division method or the like, the mechanical strength falls, distortion or other deformation becomes easy to occur in the circuit patterns, and even breakage occurs in remarkable cases.

When distortion or other deformation occurs in complementary stencil masks, overlay accuracy no longer can be carried out between the specimen and the complementary stencil masks. Also, the electron beam passed through the distorted circuit patterns is exposed by projection onto the specimen, so the accurate circuit patterns cannot be transferred.

DISCLOSURE OF THE INVENTION

The present invention was made in consideration with above circumstances and has as an object thereof to provide complementary masks improved in mechanical strength, not causing distortion in the circuit patterns, accurately aligned with the specimen, and able to accurately transfer the circuit patterns onto the specimen and a method of fabrication of the same.

Further, another object of the present invention is to provide an exposure method using such complementary masks and a semiconductor device and a method of production of the same.

To attain the above objects, a complementary mask of the present invention is a mask which has a plurality of pattern forming regions having arranged on it complementary patterns obtained by dividing first circuit patterns into complementary patterns complementary with each other and formed by openings and which have the complementary patterns arranged in the pattern forming regions so that pattern densities of the pattern forming regions become substantially the same.

To attain the above objects, a method of fabrication of a complementary mask of the present invention has a step of dividing first circuit patterns into a plurality of pattern forming regions so that pattern densities become substantially the same and assigning complementary patterns complementary with each other to the pattern forming regions and a step of forming holes comprised by complementary patterns of the pattern forming regions so that the pattern forming regions are adjacent on the same mask substrate.

To attain the above objects, an exposure method of the present invention has a step of using a first complementary mask, which is provided adjacent to each other with a plurality of pattern forming regions on which are arranged complementary patterns obtained by dividing first circuit patterns into complementary patterns complementary with each other and formed by openings and which has the complementary patterns arranged in the pattern forming regions so that the pattern densities of the pattern forming regions become substantially the same, to make a charged particle beam scan all of the pattern forming regions of the first complementary mask and transfer the complementary patterns to an exposed body, and a shifting and transferring step of shifting the mask by exactly one pattern forming region worth of distance and making the charged particle beam scan all of the pattern forming regions of the first complementary mask again to transfer the complementary patterns to the exposed body, and repeats the shifting and transferring step to transfer the complementary patterns of all the pattern forming regions and thereby transfer the first circuit patterns to the exposed body.

To attain the above objects, a semiconductor device of the present invention is one obtained by a method which has a step of using a complementary mask, which is provided adjacent to each other with a plurality of pattern forming regions on which are arranged complementary patterns obtained by dividing circuit patterns into complementary patterns complementary with each other and formed by openings and which has the complementary patterns arranged in the pattern forming regions so that the pattern densities of the pattern forming regions become substantially the same, to make a charged particle beam scan all of the pattern forming regions of the complementary mask and transfer the complementary patterns to an exposed body, and a shifting and transferring step of shifting the mask by exactly one pattern forming region worth of distance and making the charged particle beam scan all of the pattern forming regions of the complementary mask again to transfer the complementary patterns to the exposed body, and repeats the shifting and transferring step to transfer the complementary patterns of all the pattern forming regions and thereby transfer the circuit patterns to the exposed body.

To attain the above objects, a method of production of the semiconductor device of the present invention has a step of using a complementary mask, which is provided adjacent to each other with a plurality of pattern forming regions on which are arranged complementary patterns obtained by dividing circuit patterns into complementary patterns complementary with each other and formed by openings and which has the complementary patterns arranged in the pattern forming regions so that the pattern densities of the pattern forming regions become substantially the same, to make a charged particle beam scan all of the pattern forming regions of the complementary mask and transfer the complementary patterns to an exposed body, and a shifting and transferring step of shifting the mask by exactly one pattern forming region worth of distance and making the charged particle beam scan all of the pattern forming regions of the complementary mask again to transfer the complementary patterns to the exposed body, and repeats the shifting and transferring step to transfer the complementary patterns of all the pattern forming regions and thereby transfer the circuit patterns to the exposed body.

BEST MODE FOR CARRYING OUT THE INVENTION

Below, embodiments of the present invention will be explained concretely and in detail by giving embodiments and referring to the attached drawings. Note that the complementary masks etc. shown in the following embodiments are illustrations for making facilitating the understanding of the present invention and that the present invention is not limited to these illustrations.

First Embodiment

Figure 2:
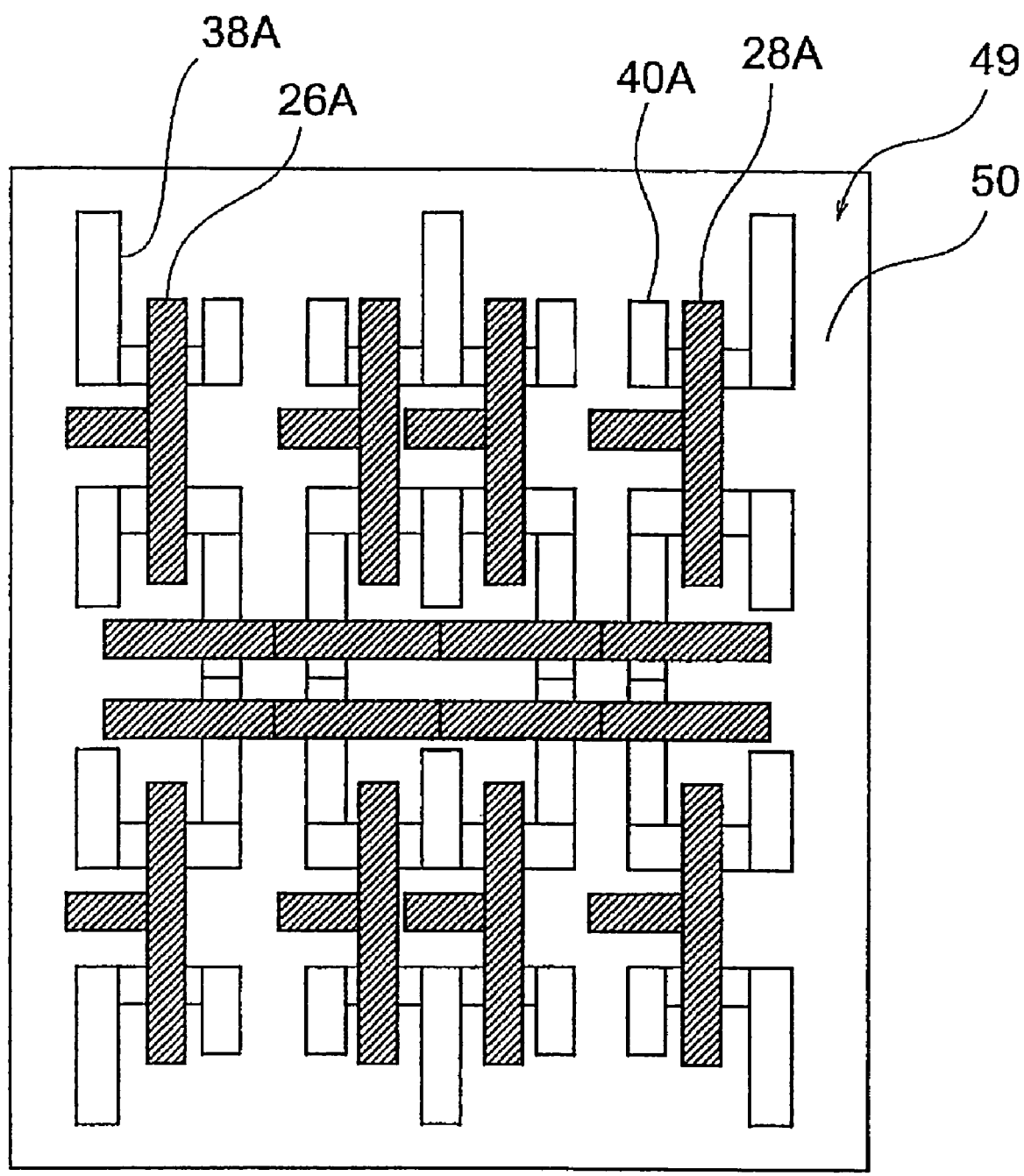
FIG. 2 is a plan view of patterns formed by transferring first patterns and second patterns to an exposure area by complementary stencil masks of a first embodiment.

The present embodiment is an example of an embodiment of complementary stencil masks. FIG. 2 is a plan view of patterns formed by transferring first circuit patterns (gate layers) and second circuit patterns (isolation layers) to an exposure area 50 by the complementary stencil masks of the present embodiment.

Figure 3:
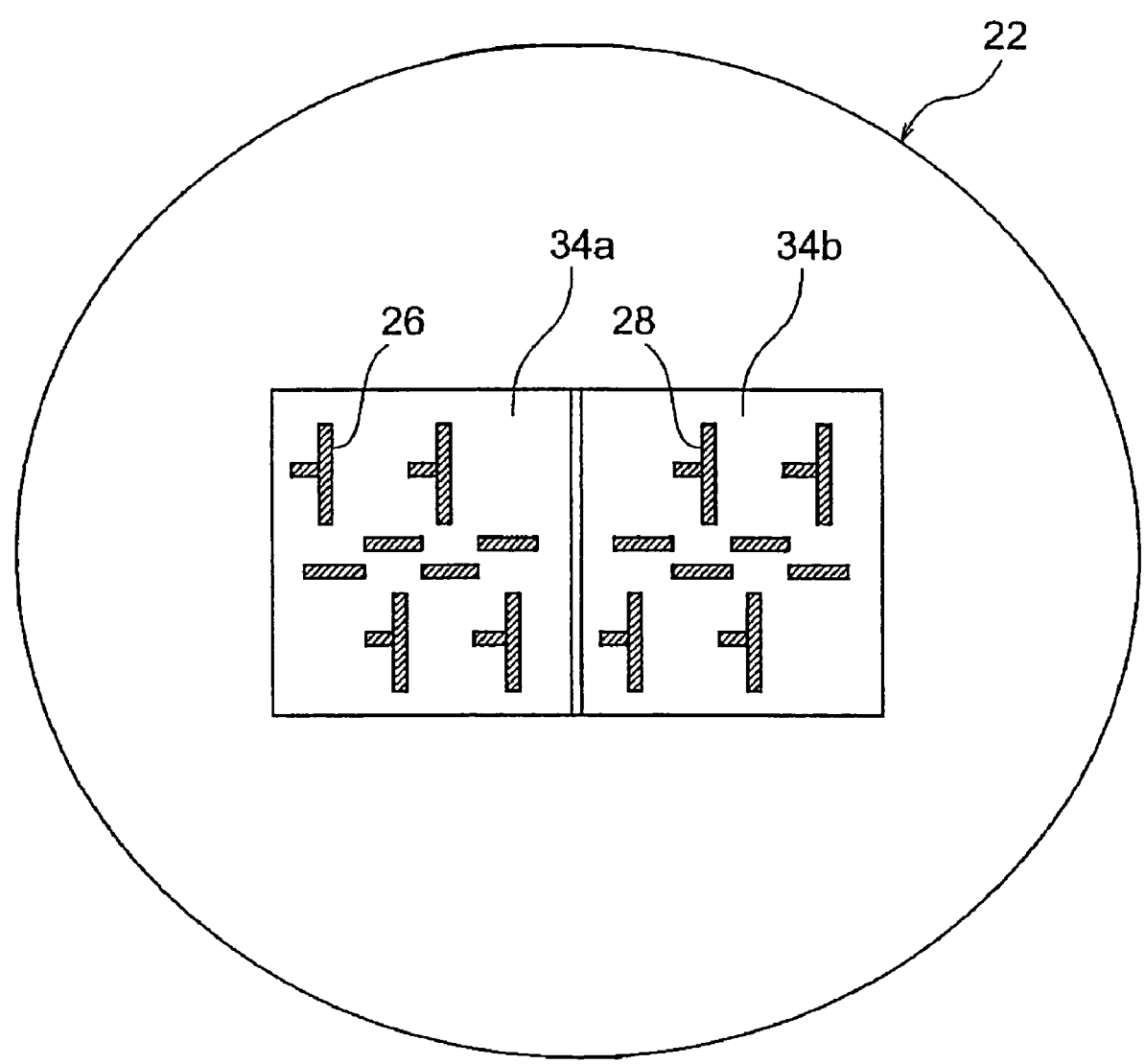
FIG. 3 is a plan view of a first complementary stencil mask of the present embodiment.
Figure 4:
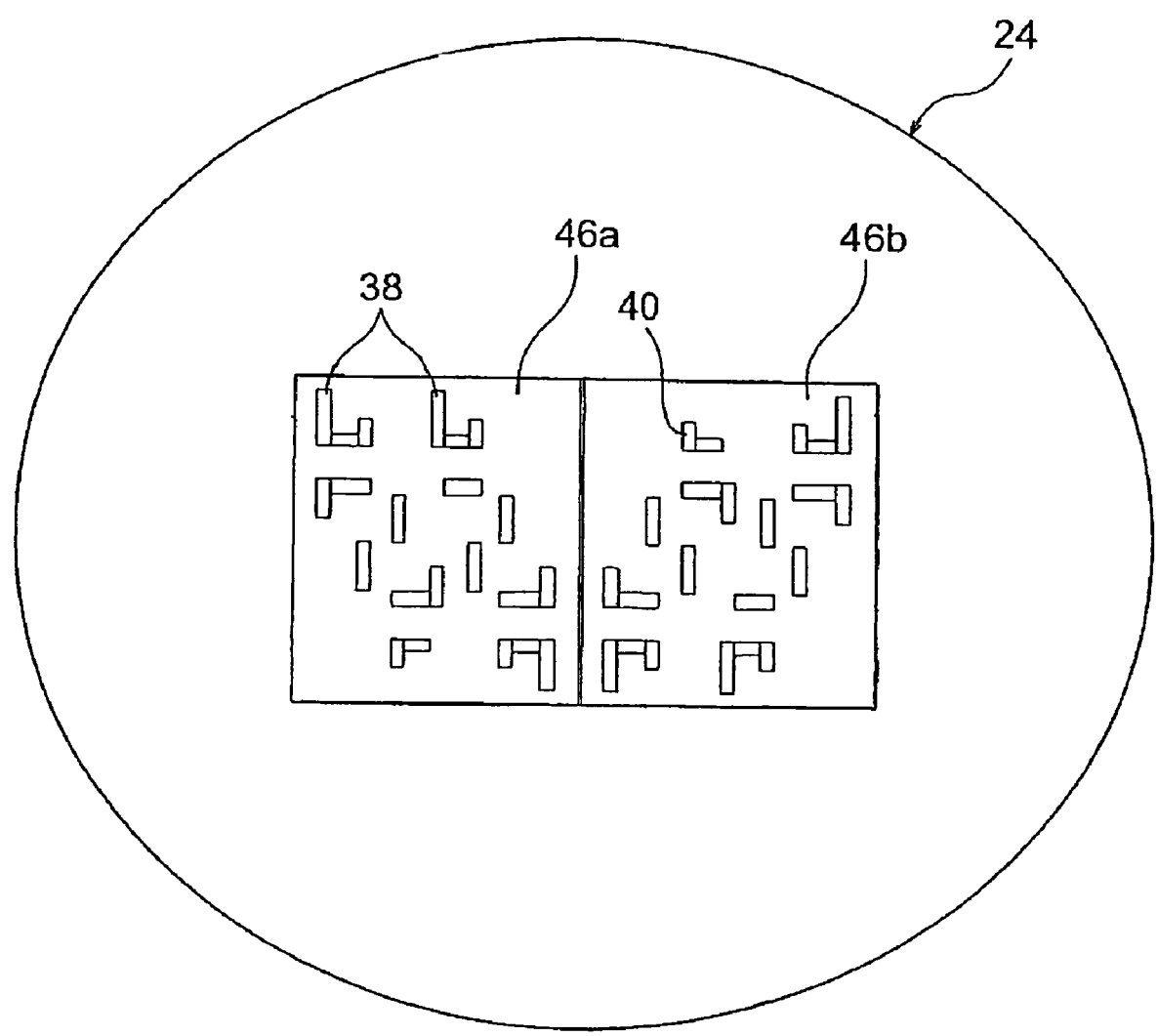
FIG. 4 is a plan view of a second complementary stencil mask of the present embodiment.

FIG. 3 is a plan view of a first complementary stencil mask having first opening patterns for transferring first circuit patterns to the exposure area 50, while FIG. 4 is a plan view of a second complementary stencil mask having second opening patterns for transferring second circuit patterns to the exposure area 50.

Figure 5:
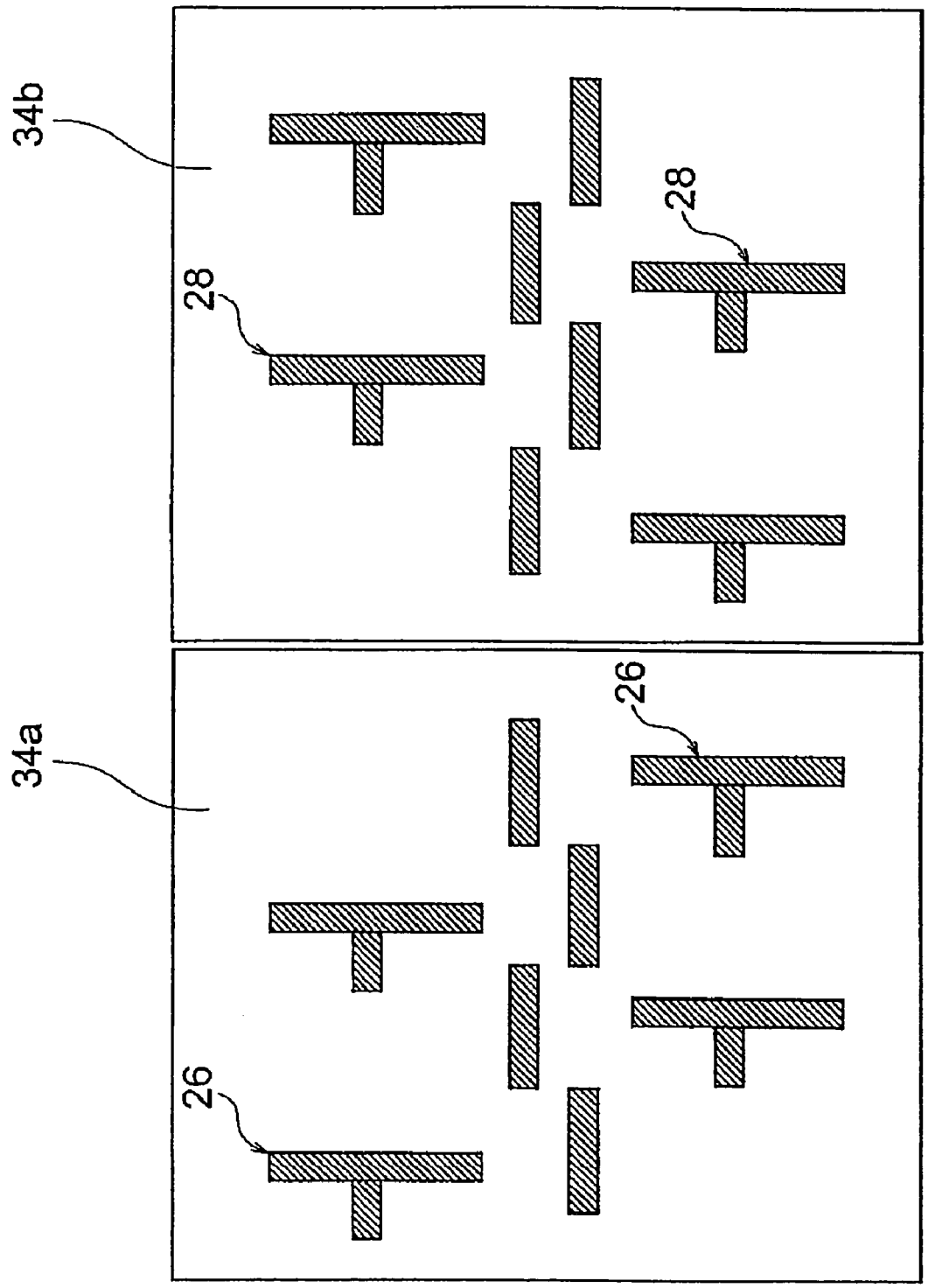
FIG. 5 is a plan view enlarging first opening patterns of the first complementary stencil mask shown in FIG. 3.
Figure 6:
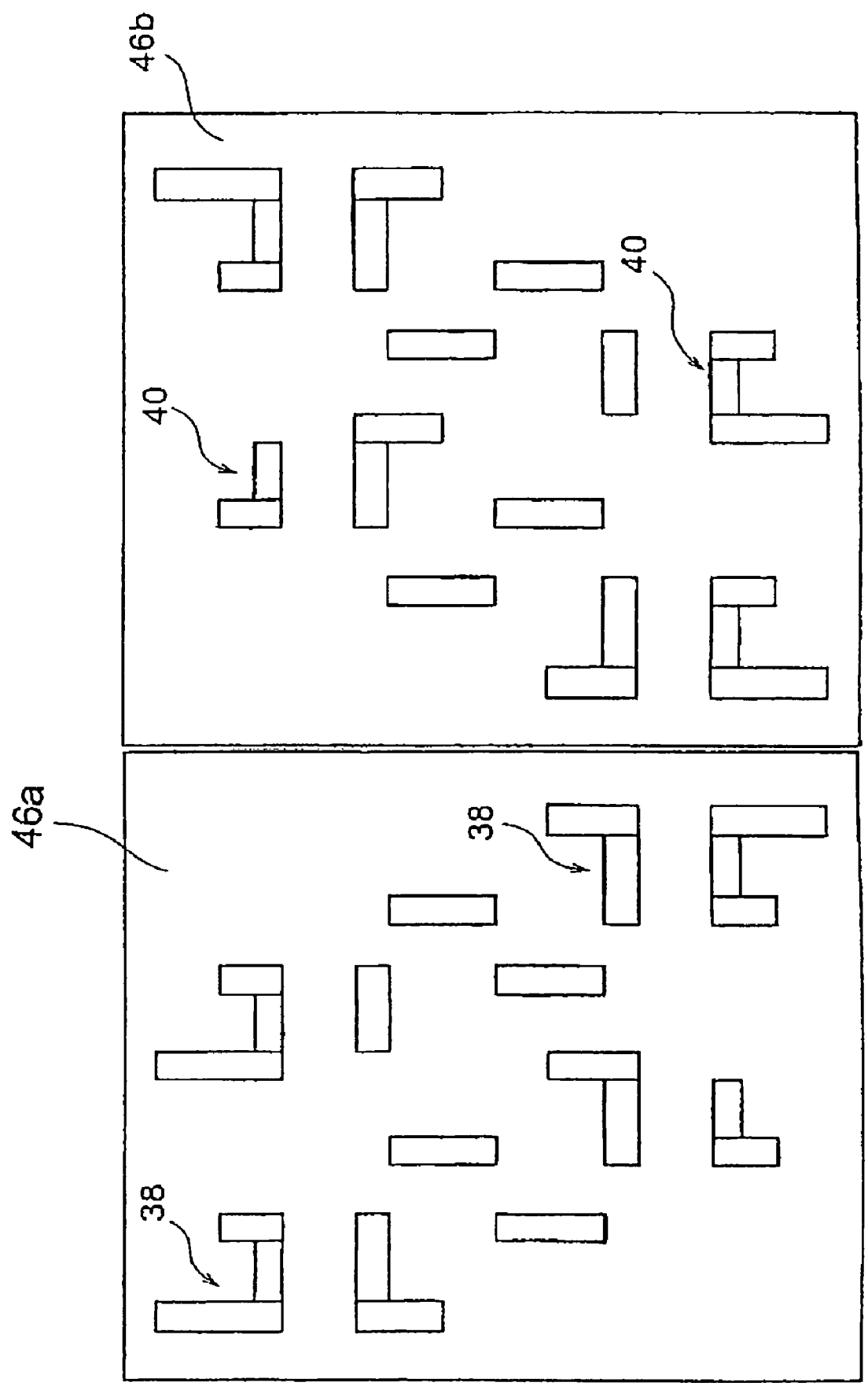
FIG. 6 is a plan view enlarging second opening patterns of the second complementary stencil mask shown in FIG. 4.

FIG. 5 is a plan view enlarging the first opening patterns of the first complementary stencil mask shown in FIG. 3, while FIG. 6 is a plan view enlarging the second opening patterns of the second complementary stencil mask shown in FIG. 4.

In the present embodiment, the first circuit patterns and the second circuit patterns configuring the semiconductor device are the gate layers and the isolation layers of memory circuits of SRAMs (static random access memories).

Here, the first circuit patterns are gate layer patterns formed by exposure in the exposure layer, while the second circuit patterns are isolation layer patterns formed by exposure in an underlying layer.

In the present embodiment, first, the second complementary stencil mask 24 is used to form by exposure isolation layer patterns 38A and 40A shown in FIG. 2 to form the underlying layer, then the first complementary stencil mask 22 is used to form by exposure gate layer patters 26A and 28A shown in FIG. 2 on this underlying layer.

The first complementary stencil mask 22 has two first pattern forming regions 34a and 34b successively arranged adjacently each other as shown in FIG. 3. The first pattern forming regions 34a and 34b are provided with first opening patterns (complementary patterns) 26 and 28 resembling the plurality of gate layer patterns 26A and 28A in the exposure area 50.

In the first complementary stencil mask 22, all first opening patterns 26 and 28 in the first pattern forming regions 34a and 34b are configured so as to resemble gate layer patterns 26A and 28A in the exposure area 50 shown in FIG. 2 in a one-to-one correspondence. Further, they are configured so that the group of the first opening patterns 26 and 28 when overlaying all first pattern forming regions 34a and 34b with each other resembles the group of all gate layer patterns 26A and 28A in the exposure area 50.

The second complementary stencil mask 24 forms a pair with the first complementary stencil mask 22 and, as shown in FIG. 4, has two second pattern forming regions 46a and 46b successively arranged adjacently each other and configured as pairs with the first pattern forming regions 34a and 34b.

The second pattern forming regions 46a and 46b are provided with second opening patterns (complementary patterns) 38 and 40 resembling the plurality of isolation layer patterns 38A and 40A in the exposure area 50.

The second pattern forming regions 46a and 46b have second opening patterns 38 and 40 resembling the isolation layer patterns 38A and 40A below the gate layer functionally related to the gate layer corresponding to the first opening patterns 26 and 28 of the first pattern forming regions 34a and 34b.

All second opening patterns 38 and 40 of the second pattern forming regions 46a and 46b resemble to the isolation layer patterns 38A and 40A of the isolation layer in the exposure area 50 shown in FIG. 2 in a one-to-one correspondence.

Further, in all second opening patterns 38 and 40, the group of the second opening patterns 38 and 40 when overlaying all second pattern forming regions 46a and 46b with each other resembles the group of all isolation layer patterns 38A and 40A in the exposure area 50.

The composite opening patterns comprised by the first opening patterns 26 and 28 and the second opening patterns 38 and 40 when overlaying the first pattern forming regions 34a and 34b and the second pattern forming regions 46a and 46b with each other are given pattern densities substantially the same for all of the pairs of the first pattern forming regions 34a and 34b and the second pattern forming regions 46a and 46b.

Figure 1:
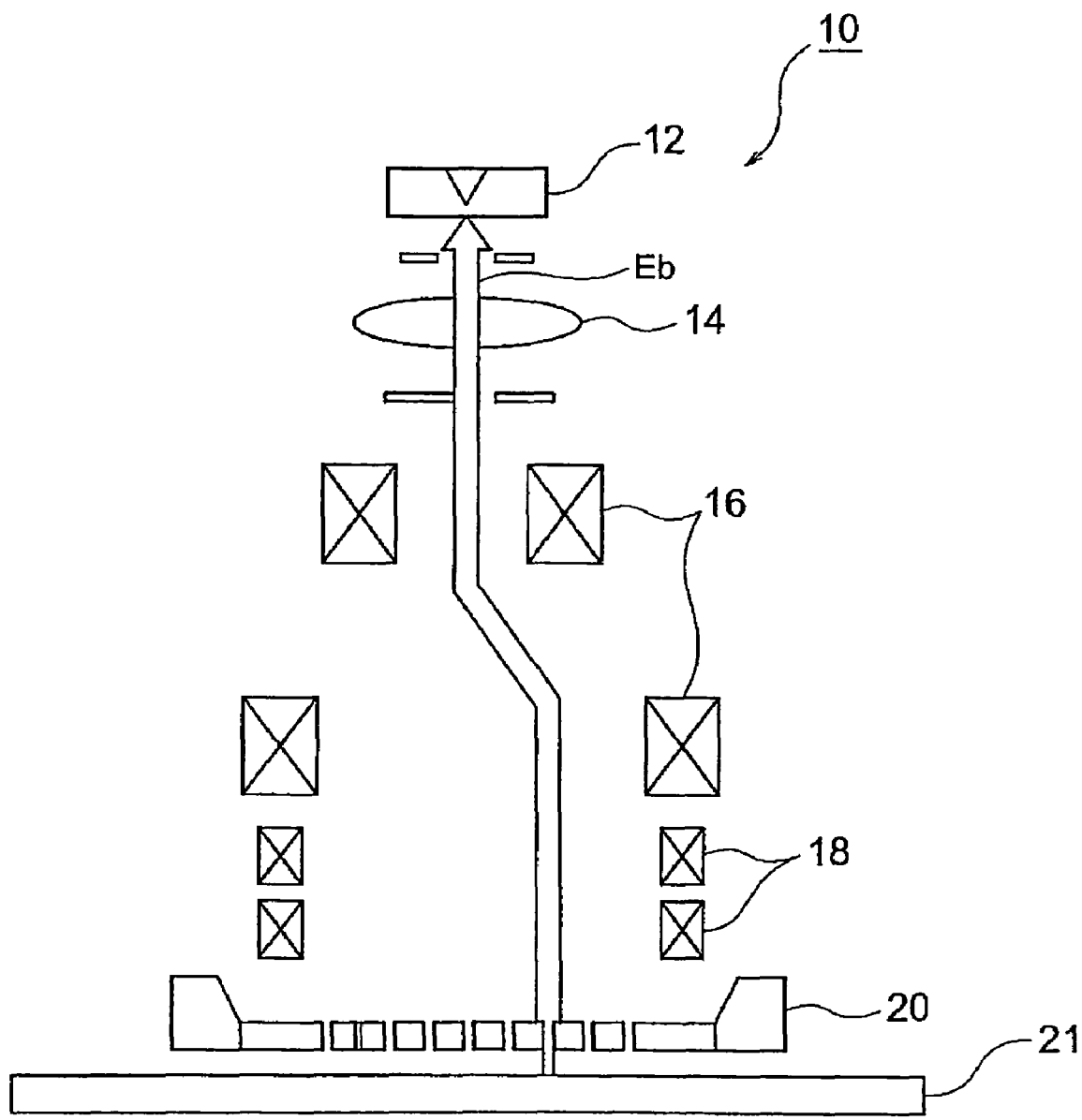
FIG. 1 is a schematic view of an example of a conventional electron beam exposure apparatus.

The first and second complementary stencil masks 22 and 24 are configured so that the gate layer patterns 26A and 28A and the isolation layer patterns 38A and 40A are exposed by projection onto the specimen 21 shown in FIG. 1 by the charged particles passing through the first opening patterns 26 and 28 and the second opening patterns 38 and 40 by firing an electron beam.

In the complementary stencil masks of the present embodiment, an opening area density of the circuit patterns formed in the first complementary stencil mask 22 can be greatly reduced and roughened, therefore the mechanical strengths of the first and second complementary stencil masks 22 and 24 can be improved.

For this reason, distortion or other deformation will not occur in the first and second complementary stencil masks 22 and 24, so the alignment between the specimen 21 and the complementary stencil masks 22 and 24 can be performed accurately. Due to this, the circuit patterns are correctly exposed by projection on the specimen 21 and thus transfer of accurate circuit patterns using two complementary stencil masks 22 and 24 can be realized.

Note that the configuration relating to the first complementary stencil mask 22 explained in the present embodiment corresponds to an embodiment of the first aspect of the invention.

The "pattern density" referred to in the present description means the degree of denseness of the patterns in the exposure area and means the ratio of the pattern area per unit area of the exposure area. The patterns existing in the exposure area are desirably divided so that intervals between patterns become uniform so as to obtain a suitable denseness state.

Figure 11:
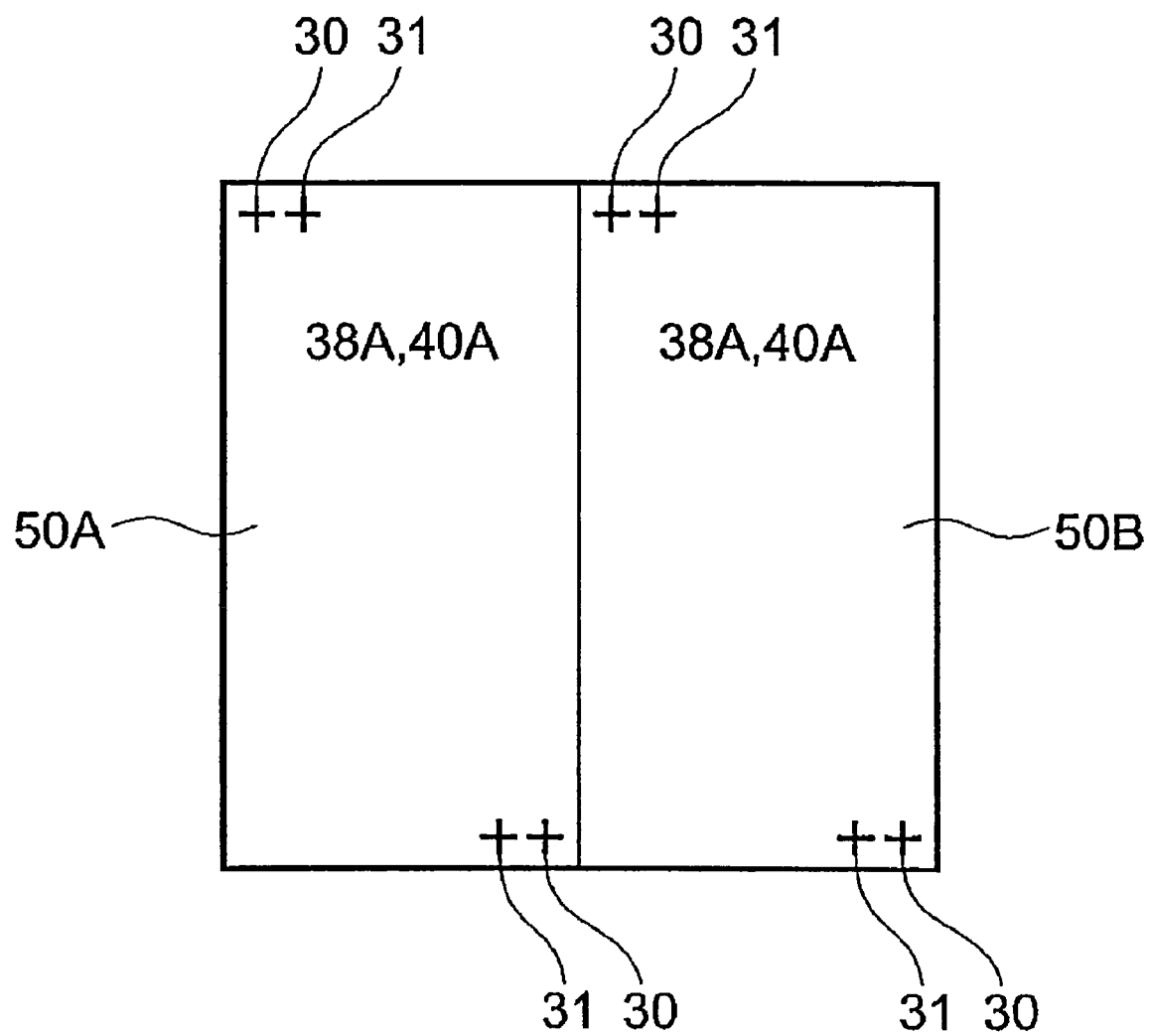
FIG. 11 is a view schematically showing a flow of an exposure process at exposure and transfer to the exposure area.

Details will be explained later, but the complementary stencil masks of the present embodiment are used as follows. Namely, the exposure areas 50A and 50B of the exposed body shown in FIG. 11 are formed by exposure with the isolation layer patterns 38A and 40A by the second complementary stencil mask 24. Then, the process of forming by exposure the isolation layer patterns 38A and 40A in the exposure areas 50A and 50B by the complementary stencil mask 24 is repeated again while shifting the exposure areas 50A and 50B one by one to thereby form by exposure the isolation layer patterns 38A and 40A in the exposure areas 50A and 50B.

Then, both of the exposure areas 50A and 50B to which the isolation layer patterns 38A and 40A are transferred are formed by exposure with the gate layer patterns 26A and 28A by the first complementary stencil mask 22. Further, the process of forming by exposure the first pattern forming regions 34a and 34b in the exposure areas 50A and 50B by the first complementary stencil mask 22 is repeated again while shifting the exposure areas 50A and 50B one by one.

Next, an explanation will be given of the method of fabrication of the complementary stencil masks described above.

In the present method of fabrication, the first complementary stencil mask 22 comprised by the plurality of first pattern forming regions 34a and 34b successively arranged adjacently each other and having first opening patterns 26 and 28 resembling the plan shapes of the plurality of gate layers in the exposure area 50 shown in FIG. 2 is fabricated. Further, the second complementary stencil mask 24 forming a pair with the complementary stencil mask 22 and comprised by second pattern forming regions 46a and 46b having second opening patterns 38 and 40 is fabricated.

Namely, in the present method of fabrication, first, as shown in FIG. 2, composite patterns 49 showing composite patterns comprised of all gate layer patterns 26A and 28A of the exposure area 50 and all isolation layer patterns 38A and 40A of the exposure area 50 are fabricated.

Figure 7:
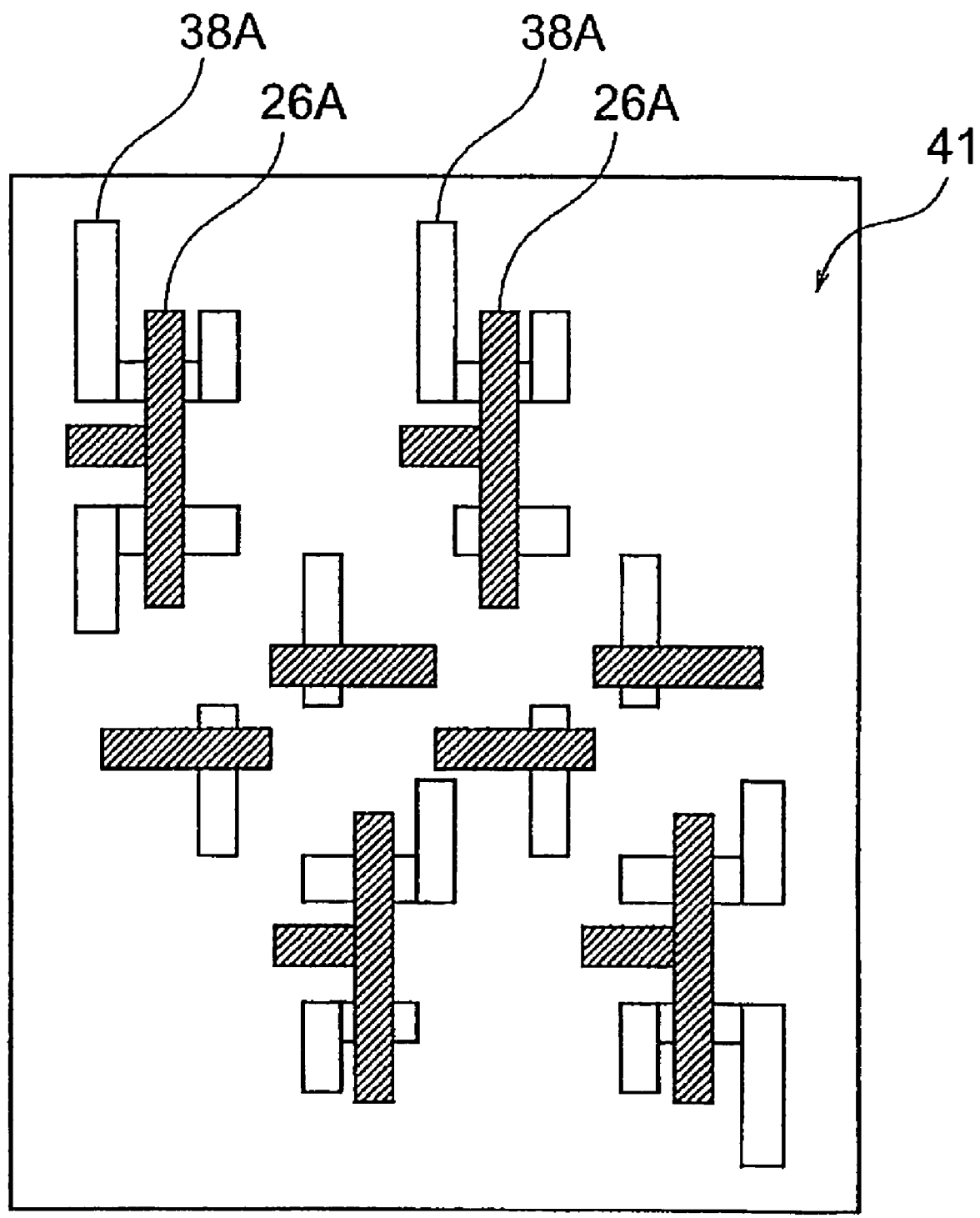
FIG. 7 is a plan view of a state where gate layers and isolation layers in composite patterns are divided into groups.
Figure 8:
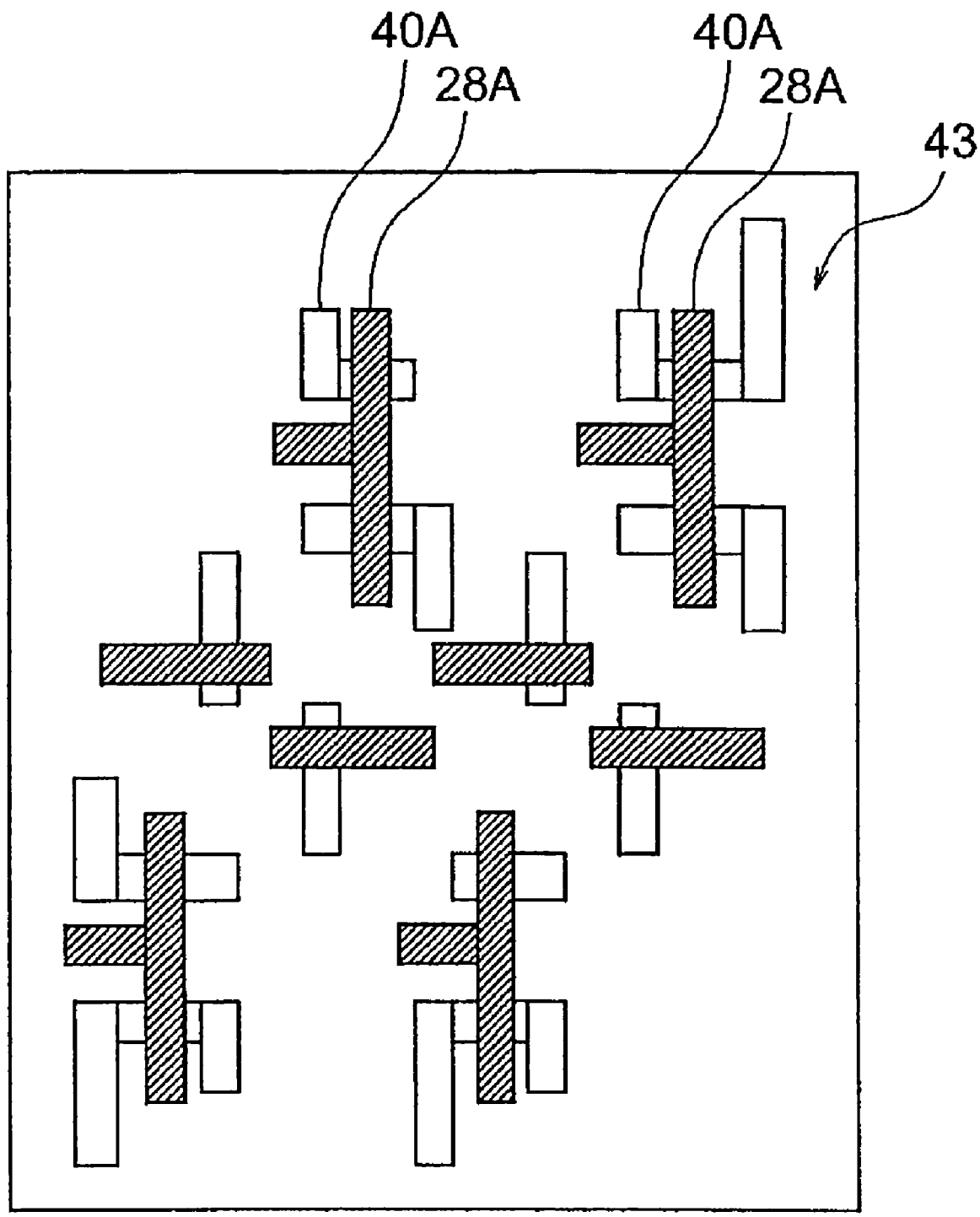
FIG. 8 is a plan view of the state where gate layers and isolation layers in composite patterns are divided into groups.

Then, as shown in FIG. 7 and FIG. 8, the gate layers 26A and 28A and the isolation layers 38A and 40A in the composite patterns 49 are divided into groups so as to give pattern densities lower than the pattern density of the composite patterns 49 and substantially the same as each other.

Then, two divided patterns 41 and 43 forming the composite patterns comprised by the gate layer patterns 26A and 28A and the isolation layer patterns 38A and 40A for the groups are fabricated.

Figure 9A:
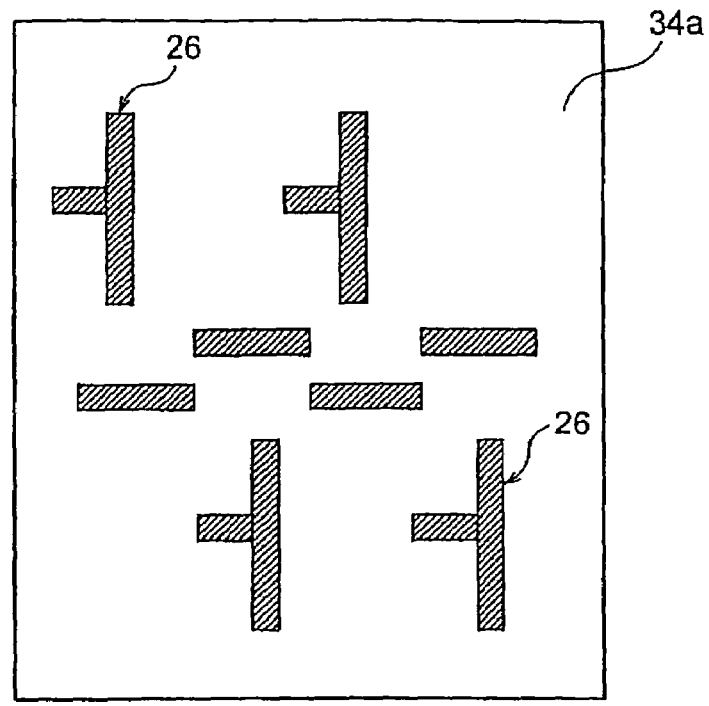
FIGS. 9A and 9B are plan views of opening patterns forming pairs among the first and second complementary stencil masks.
Figure 10A:
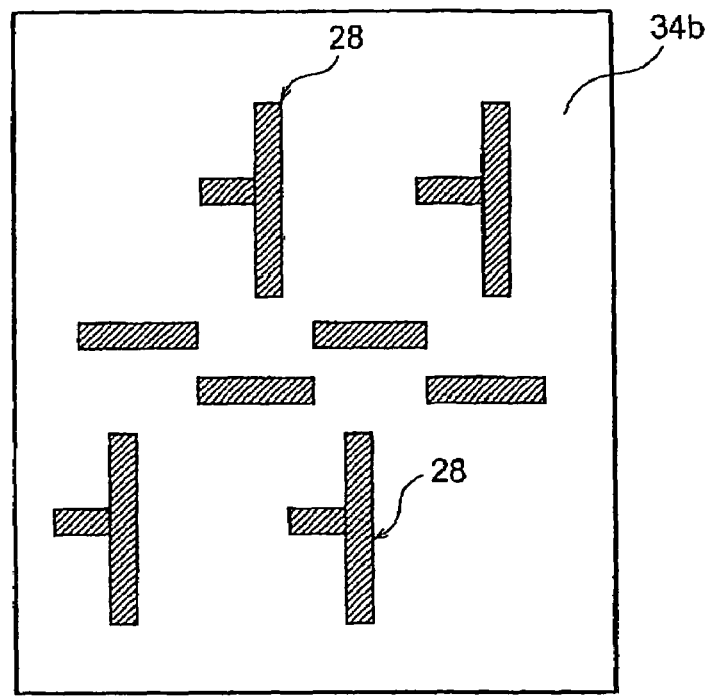
FIGS. 10A and 10B are plan views showing opening patterns forming pairs among the first and second complementary stencil masks.

Next, as shown in FIG. 9A and FIG. 10A, first pattern forming regions 34a and 34b having first opening patterns 26 and 28 corresponding to the gate layer patterns 26A and 28A constituting the divided patterns 41 and 43 are fabricated.

Figure 9B:
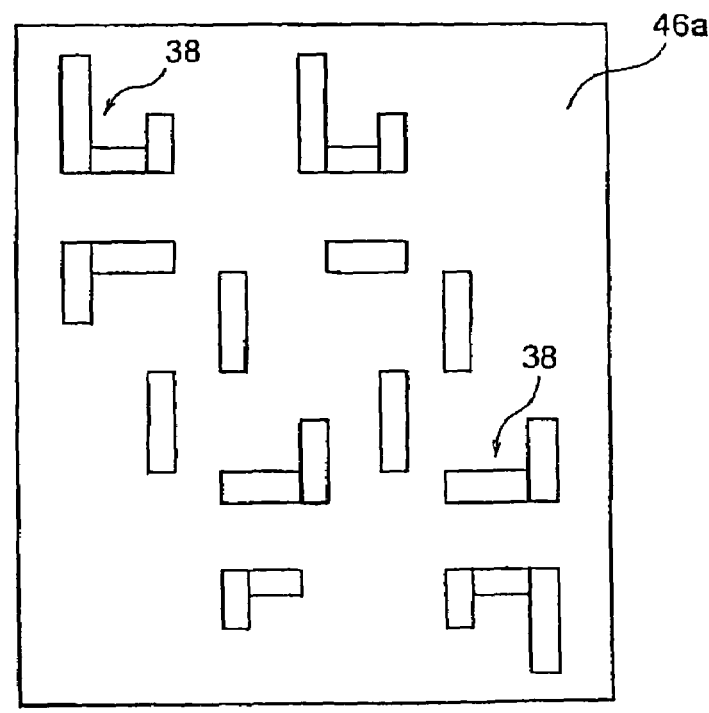
Figure 10B:
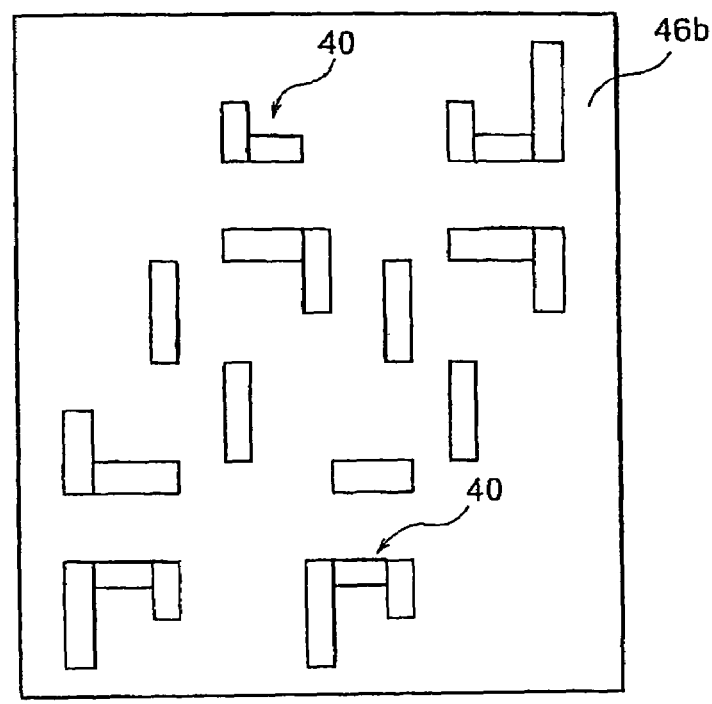

Further, as shown in FIG. 9B and FIG. 10B, second pattern forming regions 46a and 46b having second opening patterns 38 and 40 corresponding to the isolation layer patterns 38A and 40A and forming pairs with the first pattern forming regions 34a and 34b are prepared. The first pattern forming regions 34a and 34b and the second pattern forming regions 46a and 46b are fabricated for every divided pattern.

Then, as shown in FIG. 3 and FIG. 5, the first complementary stencil mask 22 formed by successively arranging the first pattern forming regions 34a and 34b adjacently each other is fabricated. Further, as shown in FIG. 4 and FIG. 6, the second complementary stencil mask 24 formed by successively arranging the second pattern forming regions 46a and 46b adjacently each other is fabricated.

By this series of steps, the complementary stencil masks 22 and 24 of the present embodiment can be easily obtained.

In individual patterns of layers constituting MOS transistors or capacitors forming a memory circuit, requirements for overlay accuracy of patterns compare severely with those between other patterns seen electrically and in terms of device functions.

Accordingly, in the grouping of the complementary stencil masks 22 and 24 of the present embodiment, the gate layers and the isolation layers at parts related electrically and in terms of device functions were assigned to the same groups as constituent members requiring strict overlay accuracy with each other.

Also, paying attention to the gate layer, the division is desirably carried out so that opening patterns do not become too close to each other and so that pattern densities (area densities) of the divided patterns 41 and 43 become equal as much as possible.

Next, an explanation will be given of an exposure method using the complementary stencil masks by referring to FIG. 11 to FIG. 14 and FIG. 15 to FIG. 18.

FIG. 11 to FIG. 14 are views schematically showing a flow of an exposure process at exposure and transfer to the exposure areas 50A and 50B by step-wisely moving the specimen 21 of FIG. 1 by the operation of a table in a state where the complementary stencil mask 22 or 24 is set on the mask stage. Illustration of the gate layer patterns and isolation layer patterns to be transferred is omitted. FIG. 15 to FIG. 18 are plan views showing actual transfer results corresponding to FIG. 11 to FIG. 14.

In the present exposure method, it is necessary to raise the overlay accuracy between the stencil masks and the specimen, therefore, at the time of exposure by the electron beam exposure apparatus 10, the exposure work is proceeded with as shown in FIG. 15 to FIG. 18 while performing the alignment as follows.

Note that, in FIG. 11 to FIG. 14, a description is made by deviating actually superimposed positions of the underlying layer patterns and the complementary stencil mask for making the explanation easy.

In the present exposure method, first, as shown in FIG. 11, the isolation layer patterns 38A and 40A are transferred to the exposure areas 50A and 50B arranged adjacently each other by the second complementary stencil mask 24.

Then, the isolation layer patterns 38A and 40A are transferred to the exposure areas 50A and 50B again by the second complementary stencil mask 24 while shifting the exposure areas 50A and 50B one by one by the operation of the table (first shifting and transferring step).

Then, the first shifting and transferring step is repeated to form the exposure areas 50A and 50B arranged adjacently each other and to which the isolation layer patterns 38A and 4OA are transferred.

Figure 15:
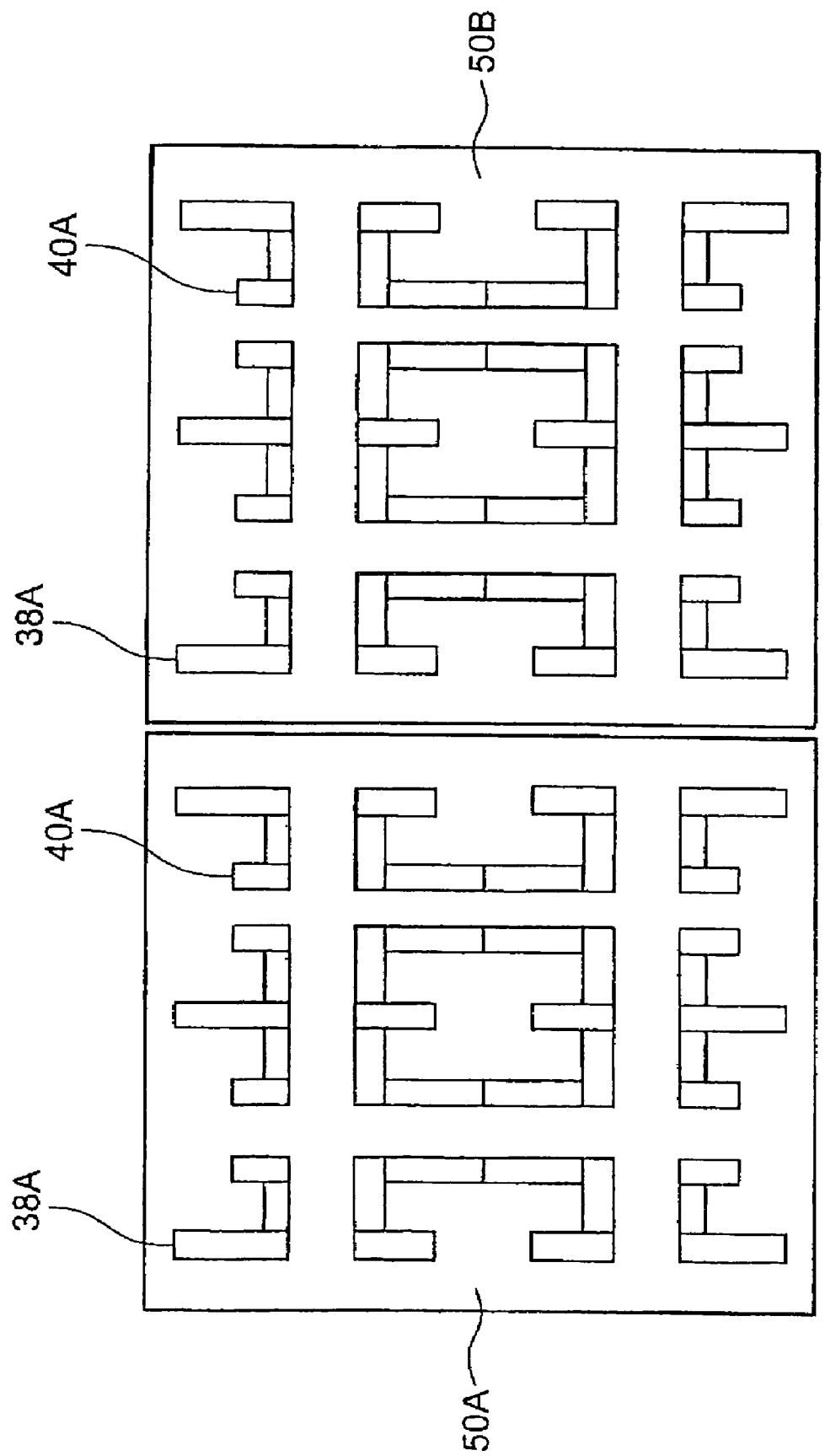
FIG. 15 is a plan view of an actual transfer result corresponding to FIG. 11.

Due to this, in the exposure areas 50A and 50B, the isolation layer patterns 38A and 40A of the underlying layer shown in FIG. 15 are obtained. In FIG. 15, the isolation layer patterns 38A and 40A are formed by exposure in both of the exposure area 50A and the exposure area 50B.

At the time of the above exposure, as shown in FIG. 11, alignment marks 30 and 31 are formed in the exposure area 50A and the exposure area 50B.

Figure 12:
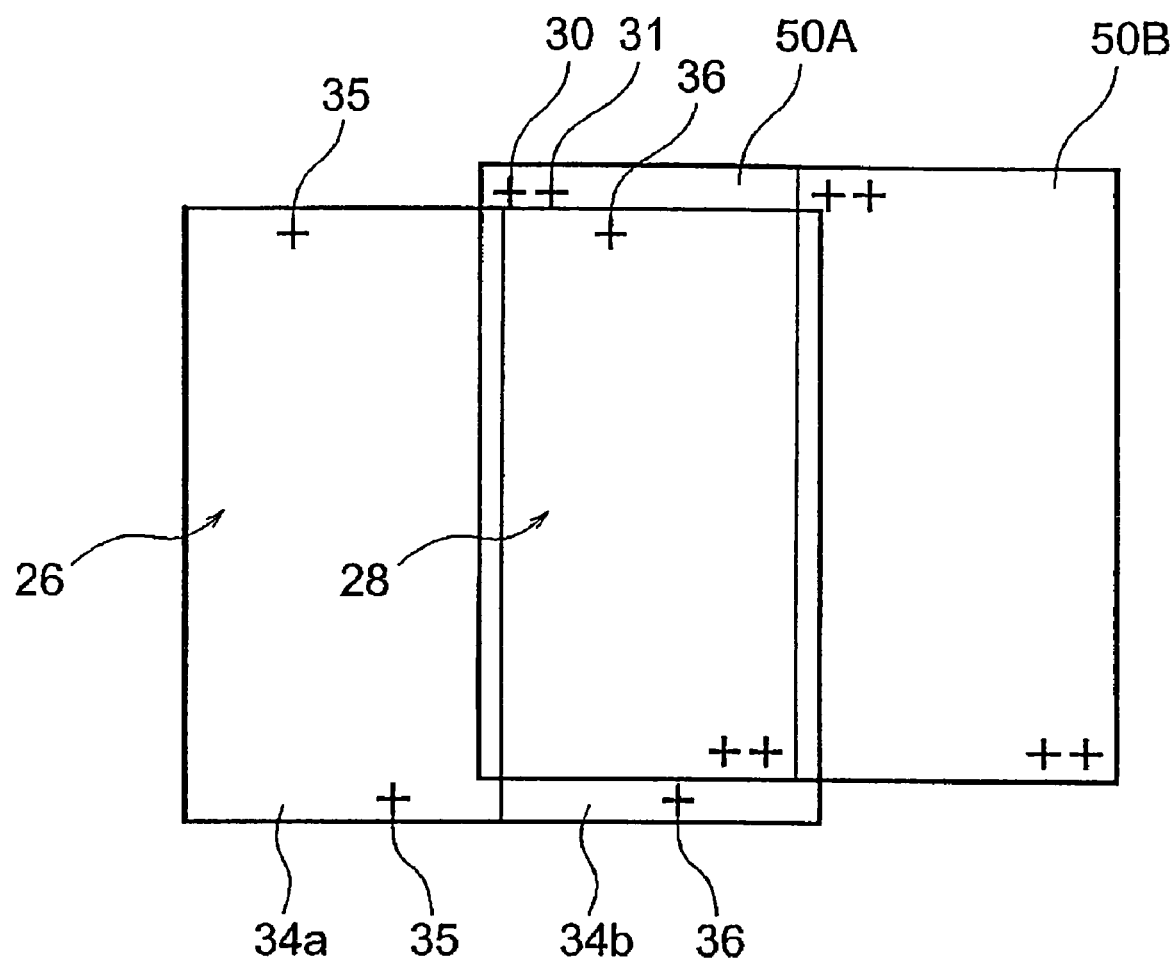
FIG. 12 is a view schematically showing a flow of an exposure process at exposure and transfer to the exposure area.

Then, as shown in FIG. 12, at the exposure area 50A of the exposure areas 50A and 50B arranged adjacently each other and to which the isolation layer patterns 38A and 40A are transferred, the gate layer patterns 28A are transferred by the first pattern forming region 34a of the first complementary stencil mask 22.

Figure 16:
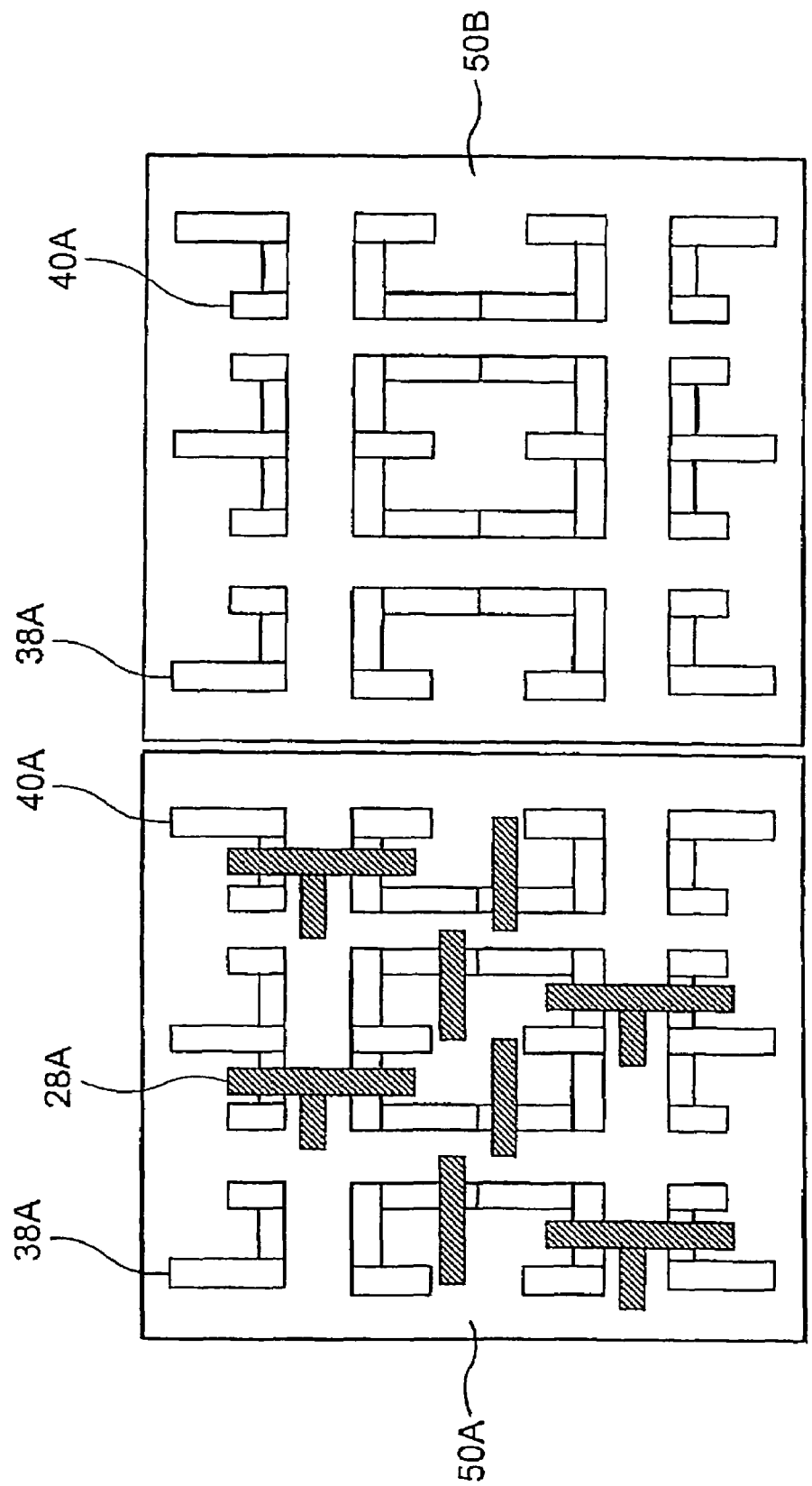
FIG. 16 is a plan view of an actual transfer result corresponding to FIG. 12.

Due to this, the transfer patterns shown in FIG. 16 are obtained.

Figure 17:
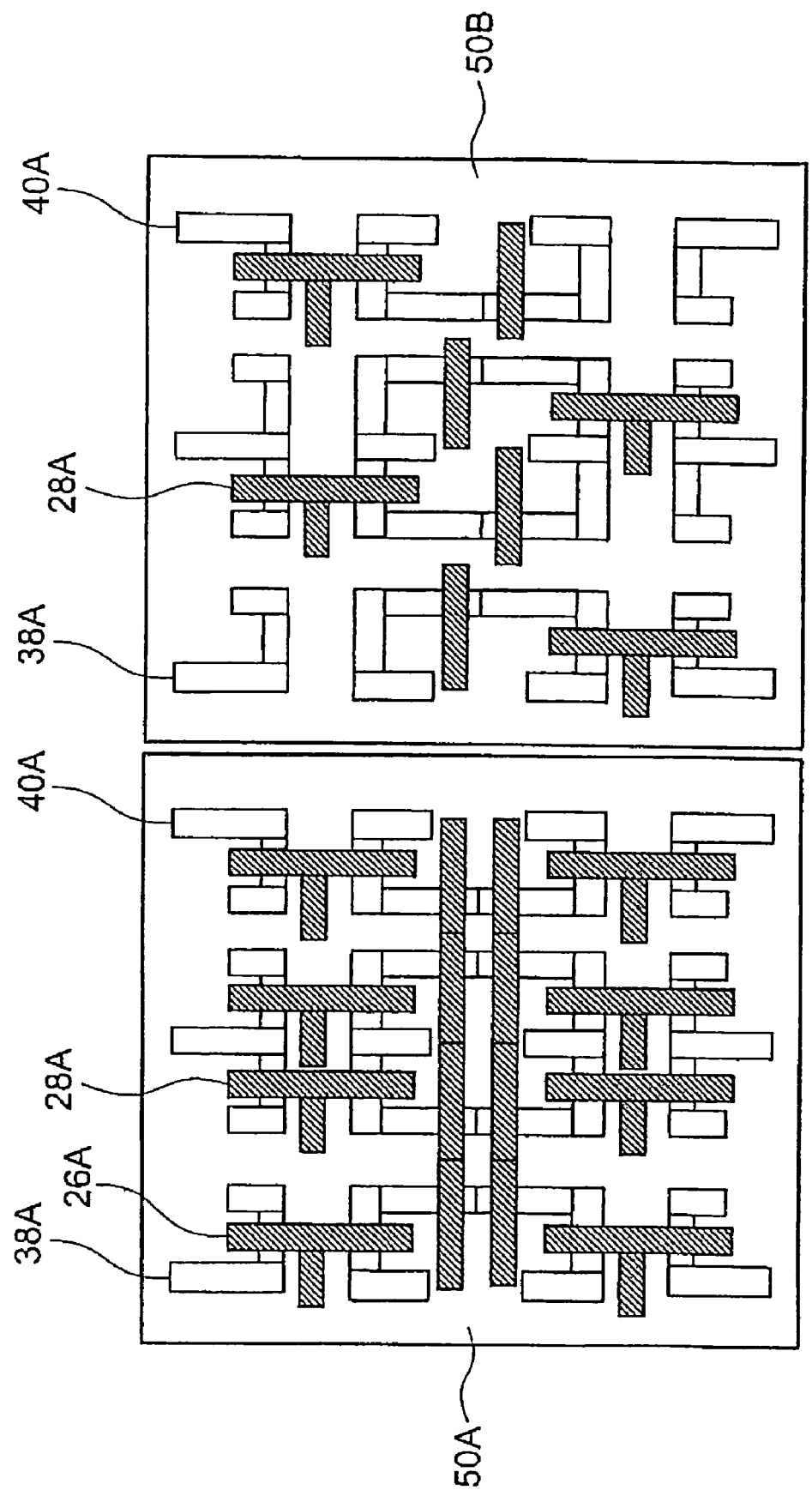
FIG. 17 is a plan view of an actual transfer result corresponding to FIG. 13.

Further, the exposure areas 50A and 50B are shifted one by one by the operation of the table, and the gate layer patterns 26A and 28A are transferred to the exposure areas 50A and 50B again by the first pattern forming regions 34a and 34b of the first complementary stencil mask 22 (second shifting and transferring step). By this, the transfer patterns shown in FIG. 17 are obtained.

Figure 18:
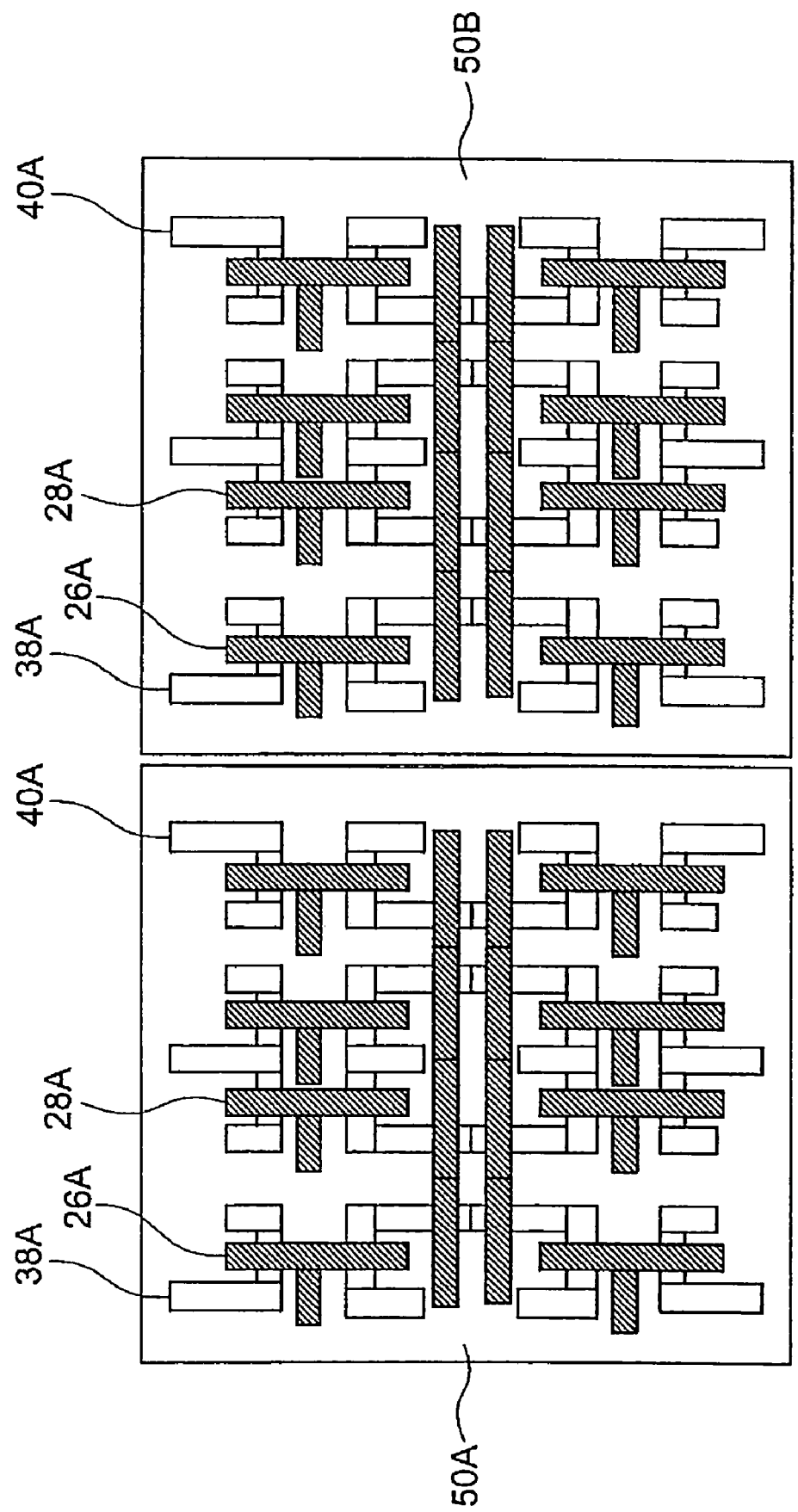
FIG. 18 is a plan view of an actual transfer result corresponding to FIG. 14.

Thereafter, by repeating the second shifting and transferring step, the transfer patterns shown in FIG. 18 are obtained.

In the above exposure method, the first pattern forming regions 34a and 34b are provided with alignment marks 35 and 36 as shown in FIG. 12. The alignment marks 35 and 36 are aligned with the alignment marks 30 and 31 by using a program stored in the electron beam exposure apparatus 10 in advance.

Figure 13:
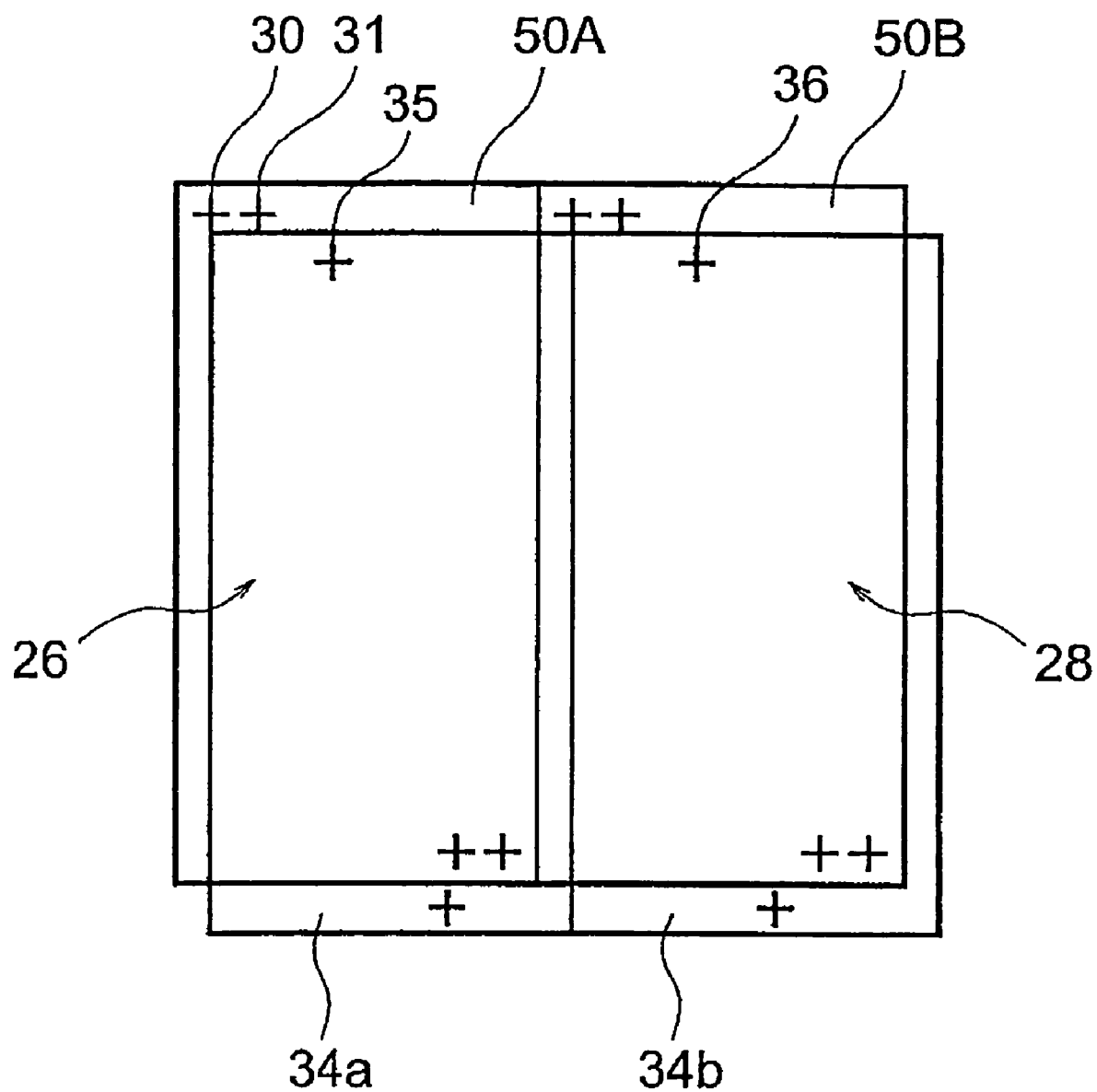
FIG. 13 is a view schematically showing a flow of an exposure process at exposure and transfer to the exposure area.
Figure 14:
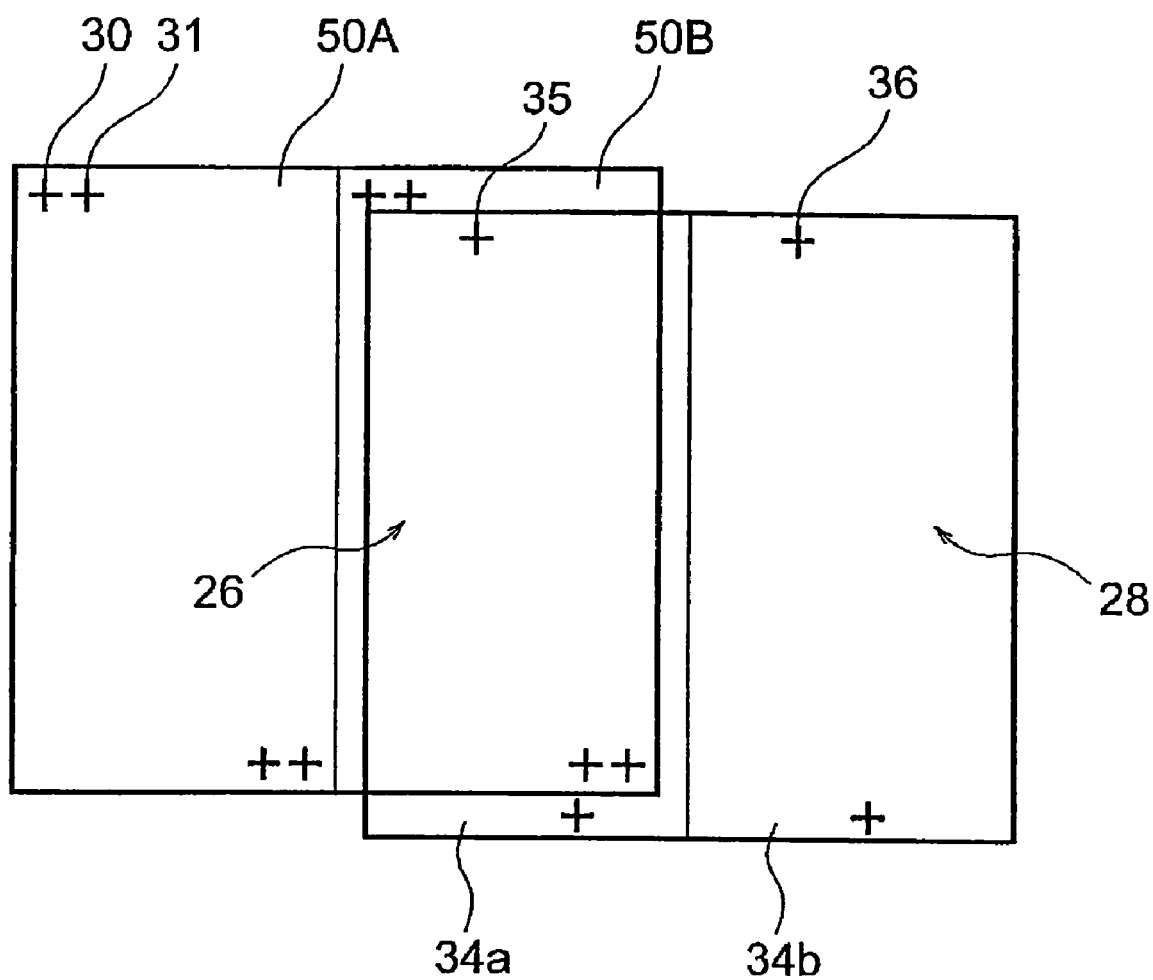
FIG. 14 is a view schematically showing a flow of an exposure process at exposure and transfer to the exposure area.

In the case such as shown in FIG. 13, if making the alignment marks 36 of the first pattern forming region 34b only alignment with the alignment mark 31, the positioning time can be shortened. This is advantageous in terms of the throughput.

In addition to this, if making the alignment marks 35 of the first pattern forming region 34a also register with the alignment marks 30 and 31, the throughput is slightly lowered, but the alignment precision is improved.

In the present embodiment, patterns of a certain semiconductor device were divided into groups so as to make it easier to suppress misalignment. Therefore, by properly alignment both complementary stencil masks 22 and 24 by the alignment marks at the time of exposure, it is possible to extremely accurately align elements not permitting misalignment such as the gate layers and the isolation layers constituting a MOS transistor.

In the present embodiment, in the exposure process, the alignment information of the exposure areas of the underlying layer patterns can be suitably weighted.

In this weighting, it is also possible to use the ratios of areas and quantities of the complementarily divided patterns of the underlying layer patterns comprised by the second opening patterns 38 and 40 or 78 and 80 and the exposure layer patterns comprised by the first opening patterns 26 and 28 or 66 and 68 transferred by exposure to these underlying layer patterns. Alternatively, it is also possible to utilize characteristics (quirks) inherent in an actually used mask writers (not illustrated) or electron beam exposure apparatuses 10.

According to such an exposure method, information of the complementary stencil masks when exposing the underlying layer patterns can be sufficiently used, so a higher overlay accuracy is obtained.

Also, alignment between the complementary stencil masks 24 and 64 and the complementary stencil masks 22 and 62 when transferring by exposure circuit patterns divided among two or more complementary stencil masks is performed using the alignment marks for the complementary stencil masks 22 and 62 prepared in advance when exposing the complementary stencil masks 24 and 64. Due to this, the overlay accuracy between complementary stencil masks is greatly improved.

Note that the configuration in accordance with the exposure method using the first complementary stencil mask 22 explained in the present embodiment corresponds to an embodiment of the third aspect of the invention.

Second Embodiment

Figure 19:
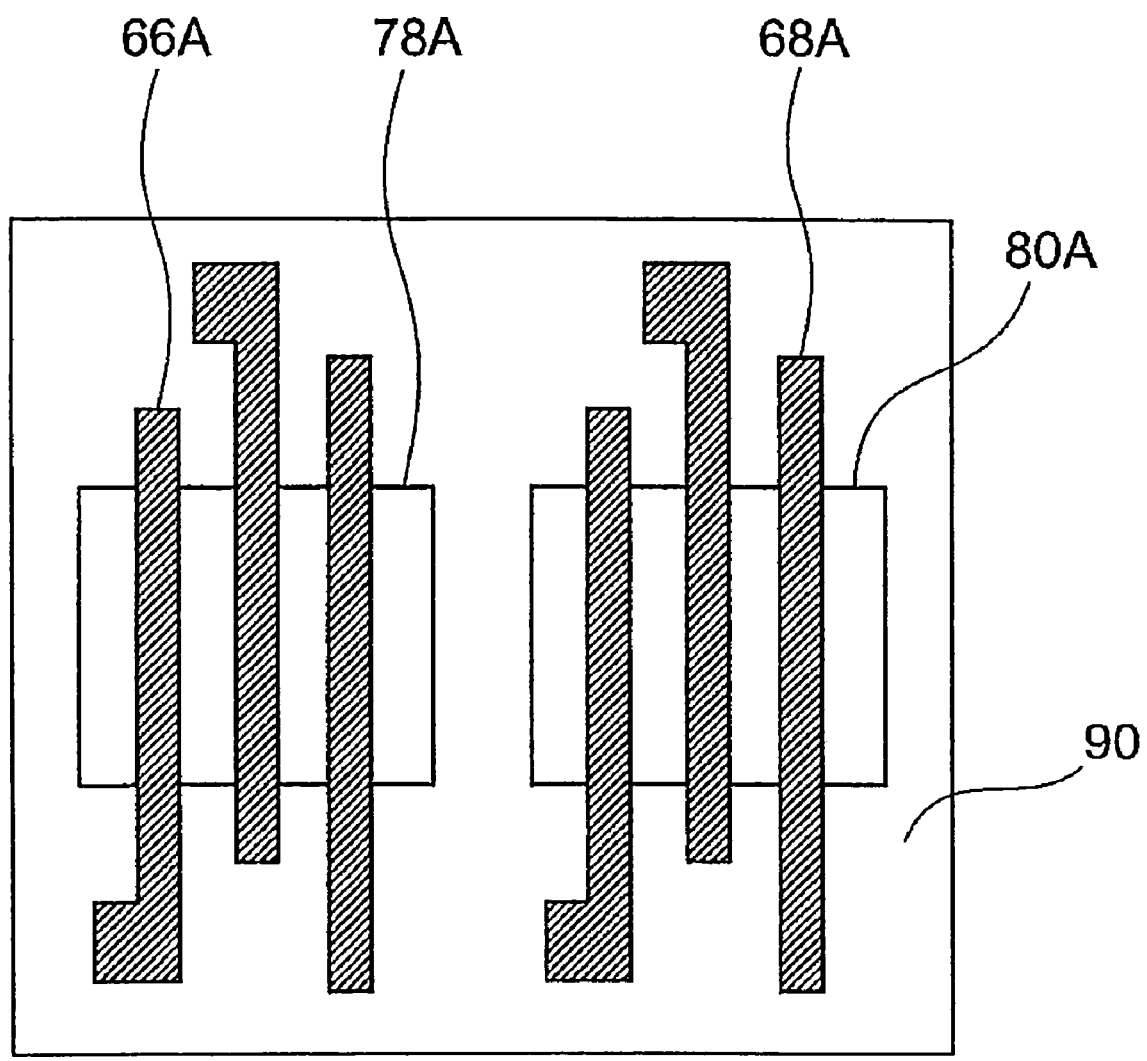
FIG. 19 is a plan view of patterns formed by transferring the gate layer patterns and the isolation layers to the exposure area by the complementary stencil masks of the second embodiment.

FIG. 19 is a plan view of patterns formed by transferring gate layer patterns 66A and 68A and isolation layer patterns 78A and 80A to an exposure area 90 by the complementary stencil masks of the present embodiment.

Figure 20:
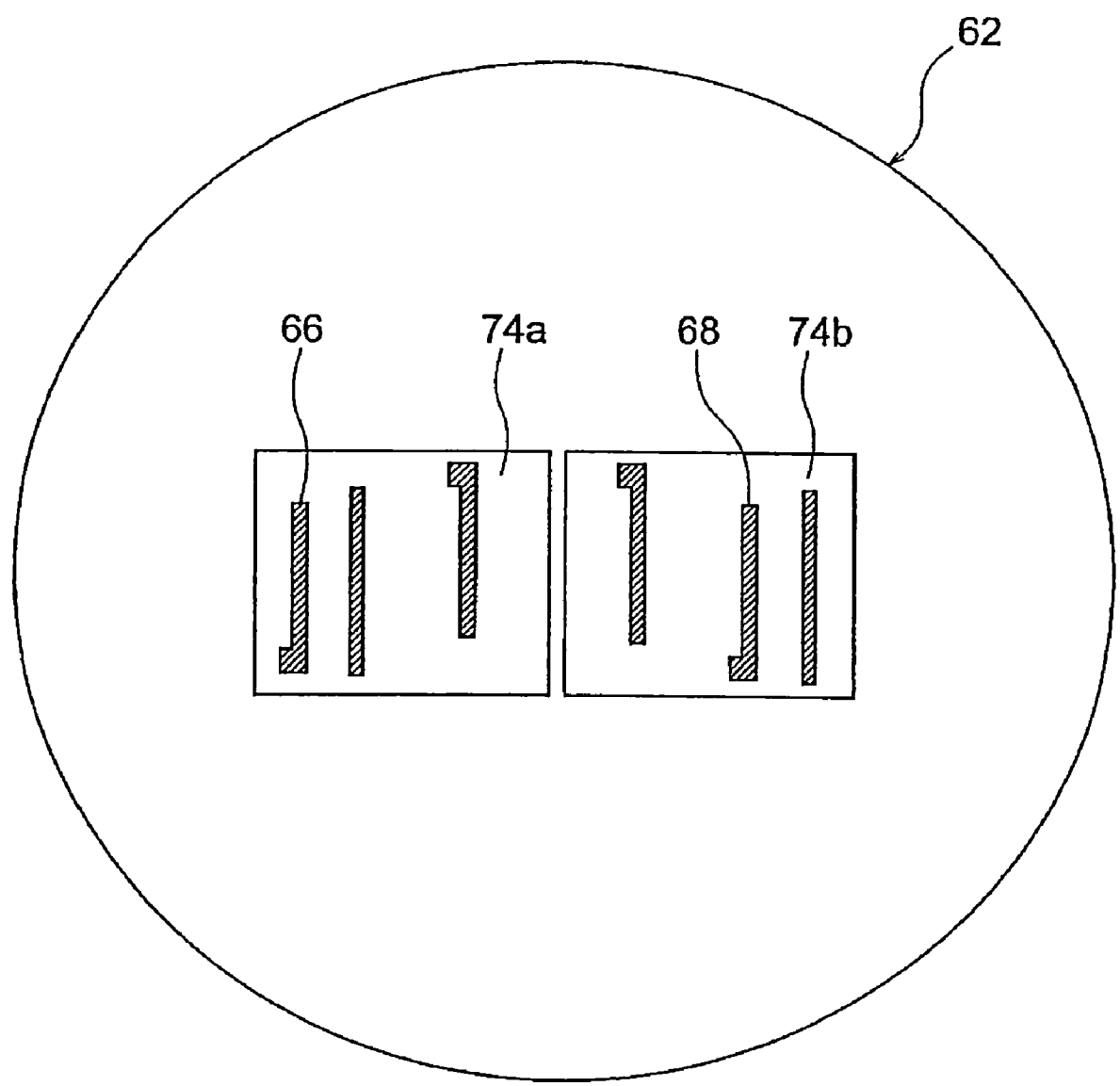
FIG. 20 is a plan view of a first complementary stencil mask of a second embodiment.
Figure 21:
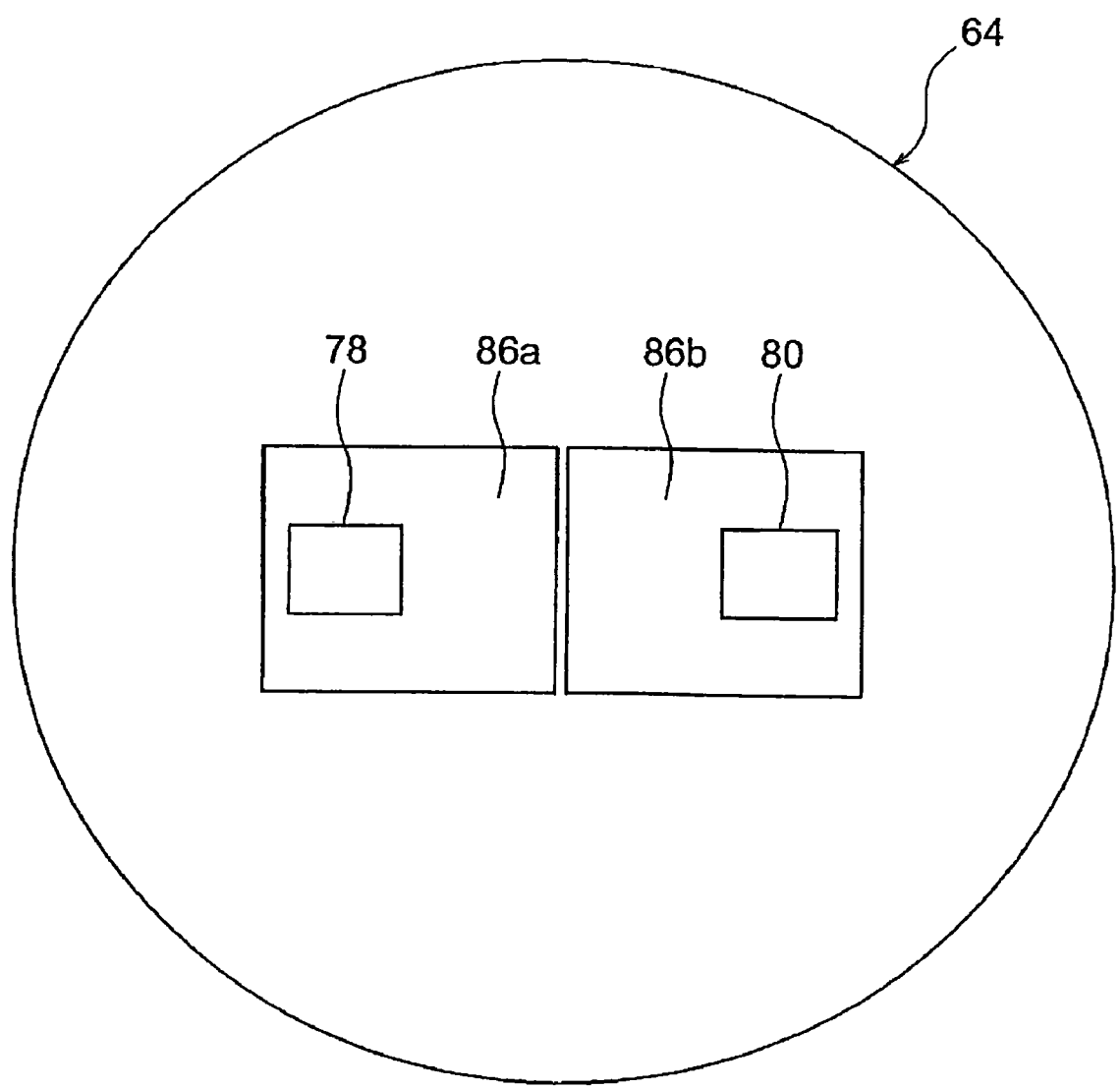
FIG. 21 is a plan view of a second complementary stencil mask of a second embodiment.

FIG. 20 is a plan view of the first complementary stencil mask having first opening patterns for transferring the gate layer patterns 66A and 68A to the exposure area 90; and FIG. 21 is a plan view of a second complementary stencil mask having second opening patterns for transferring the isolation layer patterns 78A and 80A to the exposure area 90.

As shown in FIG. 20, the complementary stencil mask 62 of the present embodiment has a plurality of first pattern forming regions 74a and 74b successively arranged adjacently each other. The first pattern forming regions 74a and 74b have first opening patterns (complementary patterns) 66 and 68 resembling the gate layer patterns 66A and 68A in the exposure area 90.

In the first complementary stencil mask 62, all first opening patterns 66 and 68 of the first pattern forming regions 74a and 74b resemble gate layer patterns 66A and 68A in the exposure area 90 in a one-to-one correspondence.

Further, in the first complementary stencil mask 62, the group of the first opening patterns 66 and 68 when overlaying all first pattern forming regions 74a and 74b with each other is made to resemble the group of all gate layer patterns 66A and 68A in the exposure area 90.

As shown in FIG. 21, the second complementary stencil mask 64 is configured as a pair with the first pattern forming regions 74a and 74b of the first complementary stencil mask 62. Also, the second complementary stencil mask 64 has second pattern forming regions 86a and 86b successively arranged adjacently each other corresponding to the first pattern forming regions 74a and 74b to be paired with and forms a pair with the first complementary stencil mask 62.

The second pattern forming regions 86a and 86b have second opening patterns (complementary patterns) 78 and 80. The second opening patterns 78 and 80 resemble the isolation layer patterns 78A and 80A shown in FIG. 19 functionally related to the gate layers 66A and 68A corresponding to the first opening patterns 66 and 68 of the first pattern forming regions 74a and 74b and provided below the gate layers.

In the second complementary stencil mask 64, all second opening patterns 78 and 80 of the second pattern forming regions 86a and 86b resemble the isolation layer patterns 78A and BOA in the exposure area 90 in a one-to-one correspondence.

Further, the group of the second opening patterns 78 and 80 when overlaying all second pattern forming regions 86a and 86b with each other resembles the group of all isolation layer patterns 78A and BOA in the exposure area 90.

In the complementary stencil masks 62 and 64, the composite opening patterns comprised by the first and second opening patterns 66 and 68 and 78 and 80 when overlaying the first and second pattern forming regions 74a and 74b and 86a and 86b have pattern densities substantially the same as each other for all pairs of first and second pattern forming regions 74a and 74b and 86a and 86b.

Also the complementary stencil masks 62 and 64 of the present embodiment can be fabricated in the same way as the method of fabrication of the complementary stencil masks 22 and 24 of the first embodiment.

Also, by using the completed complementary stencil masks 62 and 64 in the same way as the complementary stencil masks 22 and 24 of the first embodiment, the circuit patterns can be accurately exposed by projection onto the specimen 21.

In the complementary stencil masks of the present embodiment, the opening area density of the opening patterns formed in the first complementary stencil mask 62 can be greatly reduced and the mechanical strengths of the first and second complementary stencil masks 62 and 64 can be improved, so distortion or other deformation of the complementary stencil masks 62 and 64 will not occur.

For this reason, the alignment between the specimen 21 and the complementary stencil masks 62 and 64 can be accurately carried out, the opening patterns can be accurately exposed by projection, and accurate transfer of circuit patterns using the two complementary stencil masks 62 and 64 can be realized.

Further, in the first embodiment of the complementary stencil masks, it was relatively easy to assign the complementary stencil masks 22 and 24 for MOS transistors, capacitors, and other devices all together, but the present embodiment can be effectively applied to a logic circuit etc. not having repeating structures like a memory circuit.

The present invention is not limited to the explanation of the above embodiments. For example, in the present embodiments, the explanation was given of the case where the first circuit patterns and second circuit patterns functionally related to the first circuit patterns and provided in a layer different from the first circuit patterns were the gate layers and the isolation layers of MOS transistors requiring strict overlay accuracy with each other, but the invention is not limited to this. For example, they may also be a contact plug and the isolation layer connected to the contact plug. Also, they may be a metal interconnect layer and via plug connected to the metal interconnect layer.

INDUSTRIAL APPLICABILITY

The complementary masks of the present invention and the method of fabrication of same, the exposure method, and the semiconductor device and the production method of same can be utilized in the exposure process in the process of production of semiconductor devices.

The invention claimed is:

1. An exposure method comprising:

providing a first mask having a partial pattern located in a first one of a plurality of pattern forming regions, each of the pattern forming regions having a partial pattern obtained by dividing a first circuit pattern into partial patterns which are arranged in the pattern forming regions so that pattern densities of each of the pattern forming regions are substantially similar to one another and scanning each of the pattern forming regions of said first mask when each pattern forming region is positioned at a desired location above a body that is to be patterned to transfer the partial patterns to the body and thereby transferring all of said partial patterns of all pattern forming regions to thereby transfer said first circuit pattern to said body;

exposing the body with a second circuit pattern functionally related to said first circuit pattern and requiring strict overlay accuracy, said method further comprising transferring said second circuit pattern before transferring said first circuit pattern, the transferring of said second circuit pattern comprising providing a second mask with a plurality of pattern forming regions, each pattern forming region of the second mask having a partial pattern obtained by dividing said second circuit pattern into partial patterns such that pattern densities of each of the pattern forming regions for the second mask are substantially similar to one another, and scanning each of the pattern forming regions of said second mask when each pattern forming region of the second mask is positioned at a desired location above the body that is to be patterned to transfer the partial patterns to the body and thereby transferring all of said partial patterns of the second mask to thereby transfer said second circuit pattern to said body.

* * * * *